United States Patent
Sato et al.

(10) Patent No.: US 6,515,928 B2
(45) Date of Patent: Feb. 4, 2003

(54) SEMICONDUCTOR MEMORY DEVICE HAVING A PLURALITY OF LOW POWER CONSUMPTION MODES

(75) Inventors: Hajime Sato, Kasugai (JP); Kotoku Sato, Kawasaki (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/939,735

(22) Filed: Aug. 28, 2001

(65) Prior Publication Data

US 2002/0064079 A1 May 30, 2002

(30) Foreign Application Priority Data

Nov. 30, 2000 (JP) .......................... 2000-364583

(51) Int. Cl.⁷ .................................. G11C 7/00
(52) U.S. Cl. ..................... 365/222; 365/227; 365/229
(58) Field of Search ............................ 365/222, 227, 365/229, 230.06, 230.08, 189.05, 189.09

(56) References Cited

U.S. PATENT DOCUMENTS 5,365,487 A    11/1994  Patel et al. ................. 365/222
5,634,106 A *  5/1997  Yaezawa et al. ............. 365/227
5,893,135 A *  4/1999  Hasbun et al. .............. 365/120
5,999,457 A * 12/1999  Sato ....................... 365/189.01

FOREIGN PATENT DOCUMENTS

JP          2000-298982       10/2000

* cited by examiner

*Primary Examiner*—David Lam
(74) *Attorney, Agent, or Firm*—Armstrong, Westerman & Hattori, LLP

(57) ABSTRACT

A semiconductor memory device that decreases power consumption and increases performance. The semiconductor memory device includes a plurality of memory cells that undergo refreshing to maintain data. The semiconductor memory device includes a normal operation mode for performing normal operation with the memory cells, and a plurality of low power consumption modes for decreasing power consumption when the semiconductor memory device is in a standby state. The semiconductor memory device includes a mode setting circuit that sets one of the low power consumption modes.

30 Claims, 23 Drawing Sheets

Fig.2
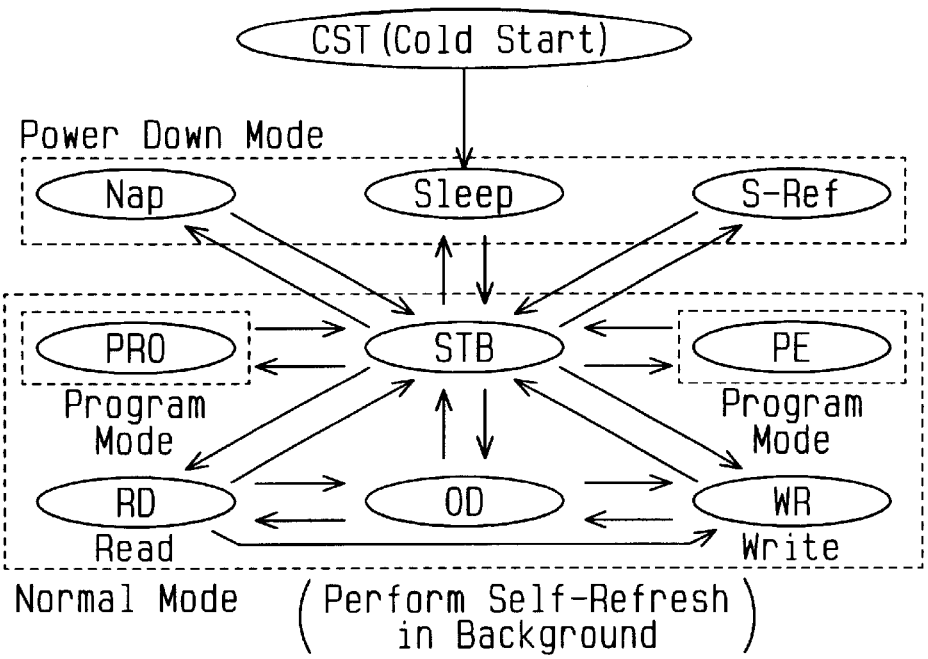
Fig.3
| Mode Terminal (CE2) | "H" | | "L" | |
|---|---|---|---|---|
| Internal Operation | Internal Power Supply | REF Operation | Internal Power Supply | REF Operation |
| Sleep | Activate | Full REF | Deactivate | Stop |
| Nap | Activate | Full REF | Activate | Stop |
| Selected REF | Activate | Full REF | Activate | Selected REF |
Fig.4
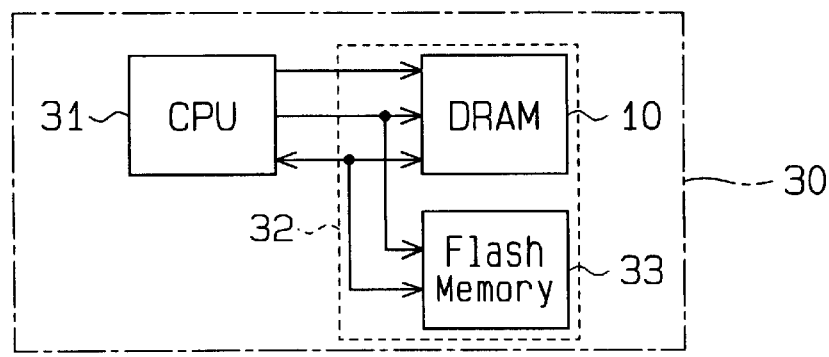

Fig.8

| Command | CE2 | /CE1 | /WE | /OE | /LB | /UB | LDQ | UDQ | Mode |
|---------|-----|------|-----|-----|-----|-----|-----|-----|------|
| C1 | L | * | * | * | * | * | HZ | HZ | PD |
| C2 | H | H | * | * | * | * | HZ | HZ | STB |
| C3 | H | L | H | H | * | * | HZ | HZ | OD |
| C4 | H | L | L | H | L | L | Din | Din | WR |
| C5 | H | L | L | H | L | H | Din | * | LWR |
| C6 | H | L | L | H | H | L | * | Din | UWR |
| C7 | H | L | L | H | H | H | * | * | Non WR |
| C8 | H | L | H | L | L | L | Dout | Dout | RD |
| C9 | H | L | H | L | L | H | Dout | * | LRD |
| C10 | H | L | H | L | H | L | * | Dout | URD |
| C11 | H | L | H | L | H | H | HZ | HZ | Non RD |

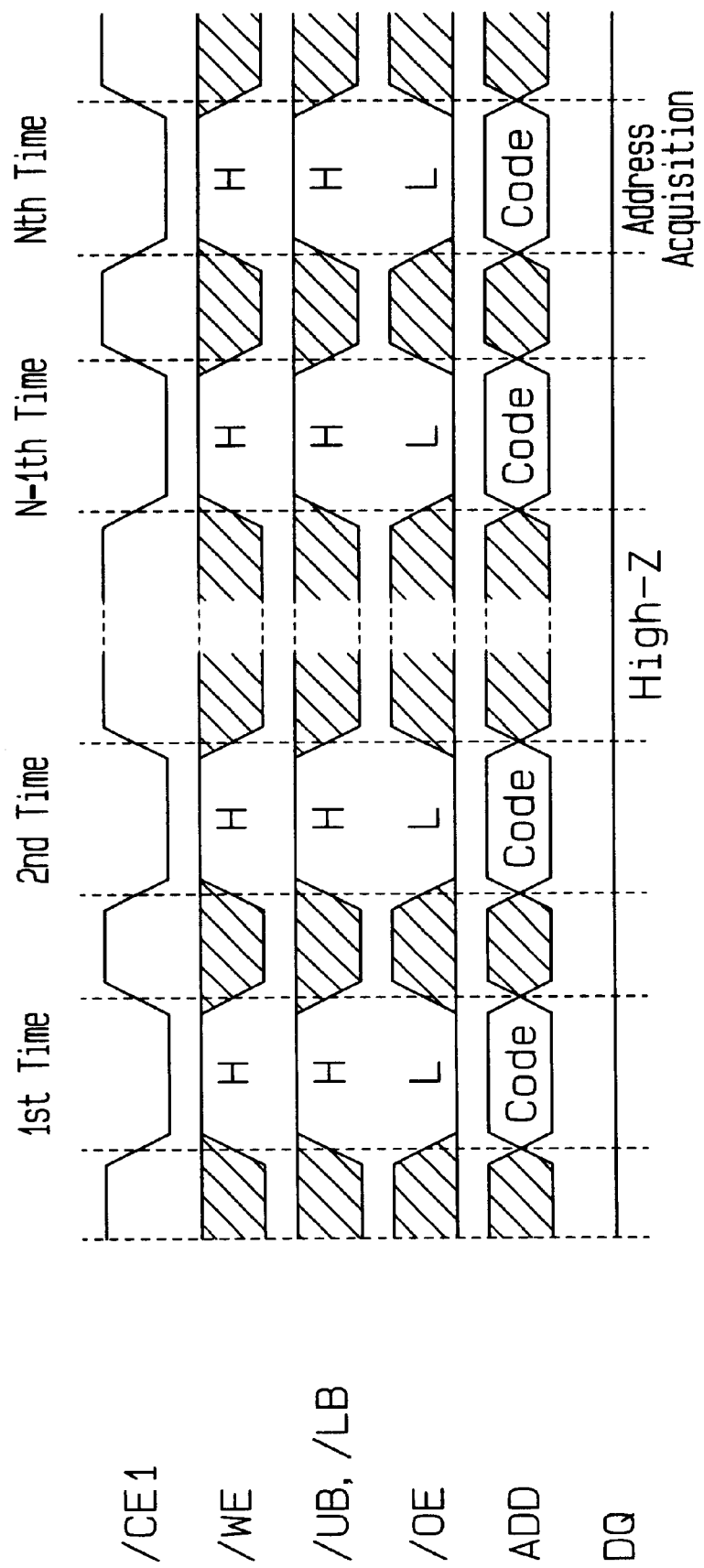

Fig.10A

| Address | A0 | A1 | A2 | A3 |
|---|---|---|---|---|
| Mode | Nap 1/4 Selected REF/Sleep | | 1/4 Selected REF Block Section | |

Fig.10B

| A0 | A1 | Mode |
|---|---|---|
| L | L | Nap |
| L | H | 1/4 Selected REF |
| H | L | Reserve |
| H | H | Sleep |

Fig.10C

| A2 | A3 | 1/4 Block Section |
|---|---|---|
| L | L | #00 |
| L | H | #10 |
| H | L | #01 |
| H | H | #11 |

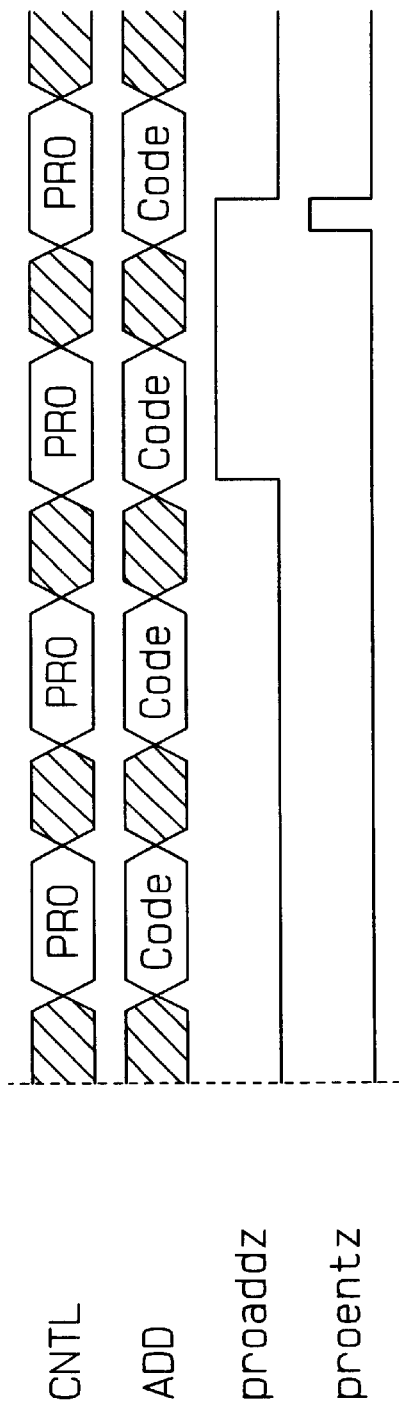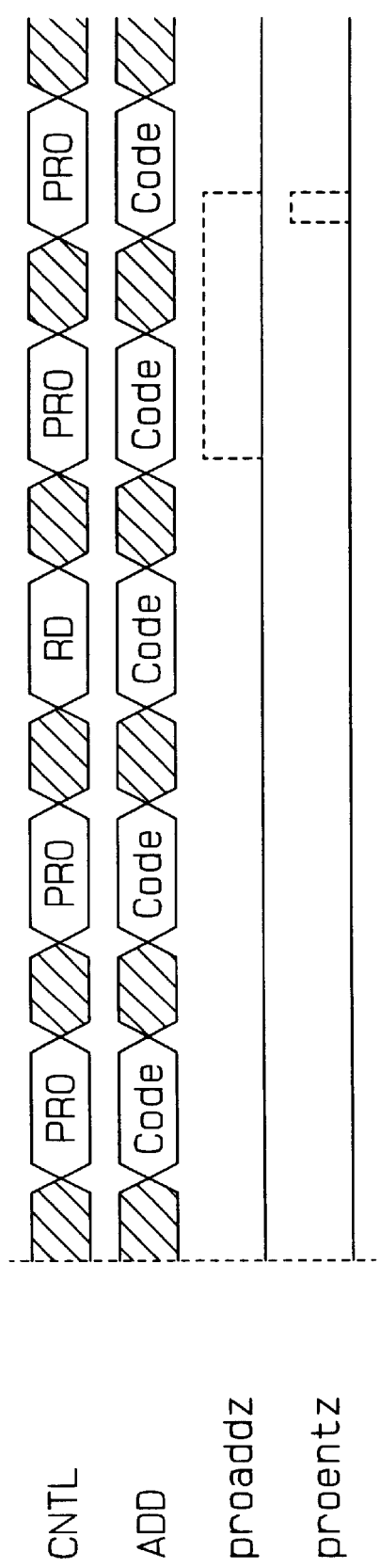

Fig. 25

| f<1> | f<0> | A<1> | A<0> | A<1> | A<0> | Block No. |
|------|------|------|------|------|------|-----------|
| L | L | L | L | L | L | #00 |
| L | L | L | L | H | H | #01 |
| L | L | H | H | L | L | #10 |
| L | L | H | H | H | H | #11 |
| L | H | L | L | H | L | #01 |
| L | H | L | L | L | H | #00 |
| L | H | H | H | H | L | #11 |
| L | H | H | H | L | H | #10 |
| H | L | L | H | L | L | #10 |
| H | L | L | H | H | H | #11 |
| H | L | H | L | L | L | #00 |
| H | L | H | L | H | H | #01 |
| H | H | L | H | H | L | #11 |
| H | H | L | H | L | H | #10 |
| H | H | H | L | H | L | #01 |
| H | H | H | L | L | H | #00 |

SEMICONDUCTOR MEMORY DEVICE HAVING A PLURALITY OF LOW POWER CONSUMPTION MODES

BACKGROUND OF THE INVENTION

The present invention relates to a semiconductor memory device, and more particularly, to a combined memory system formed by a DRAM and a nonvolatile memory that is mainly installed in mobile devices.

Portable devices, such as a cellular phone, a personal handyphone system (PHS), or a personal digital assistant (PDA), which is provided with communication functions, have become compact. Further, the amount of communication data handled by portable terminals has been increasing. For example, in addition to conversation functions, a cellular phone functions to transmit text data and image data. Further, it is predicted that a cellular phone will be employed as an information terminal that uses the Internet (portable personal computer).

Additionally, the communication speed of a portable device has increased, and the miniaturization of the portable devices has resulted in the incorporation of smaller batteries. Accordingly, a memory installed in a portable device is required to have high operating speed, large capacity, and low power consumption. It is further required that the cost of cellular phone components be reduced to make the cellular phone more price competitive. Thus, it is required that a working memory be inexpensive and have a large capacity.

An SRAM having a predetermined memory capacity (e.g., about four megabits) has been installed in a portable terminal such as cellular phone to function as a working memory that stores necessary data during operation. However, the employment of a flash memory and a DRAM in lieu of the SRAM has been proposed to increase the amount of communication data and to increase communication speed. A DRAM is compatible with an SRAM of an asynchronous memory system.

The DRAM is advantageous in that its cost per bit is low and in that it performs read/write operations at high speeds. However, the DRAM consumes power to maintain data when in a standby state. The power consumption in the standby state is several hundreds of microamperes when the DRAM is in a cell refresh mode in which the DRAM automatically and continuously maintains the data of the entire memory. When the DRAM is in a standby mode in which written data need not be held, the power consumption is several tens of microamperes.

A flash memory is advantageous in that it does not require refreshing and in that its power consumption in a standby mode is several microamperes. However, the flash memory requires several microseconds to several tens of microseconds for data to be written. Thus, it takes time to write data.

Accordingly, the DRAM is used as a large capacity, high speed working memory during communication. The data that is to be held in a standby state is transferred from the DRAM to the flash memory before deactivating the DRAM. By operating in such manner, the power consumption of a cellular phone decreases.

When the cellular phone shifts from a standby state to a conversation state, the data in the flash memory must be rewritten to the DRAM after reactivating the DRAM. Such operation produces a wait (system busy) time, which in turn, decreases the performance of the entire system (cellular phone).

To solve such shortcoming, a DRAM provided with a partial refresh function may be employed. The partial refresh function refreshes data of only predetermined memory sections. In a cellular phone, when the power is on, as long as some pieces of data are held, the remaining data need not be held. Therefore, the memory area to which data is to be held may be designated. Alternatively, the data that is to be held may be written to a memory section that is refreshed. The power consumption of such DRAM is lower than that of a DRAM that refreshes the entire memory cells. Further, the wait time required for the data in the flash memory to be rewritten to the DRAM decreases. Accordingly, the performance of the cellular phone does not decrease.

However, when low power consumption is an important factor in a portable device, it is preferred that that the DRAM be completely deactivated during the standby mode. Further, a system that selectively performs partial refreshing or complete deactivation of the DRAM in accordance with the state of the portable device may be designed to decrease the wait time and power consumption. In such manner, a semiconductor memory device that enables a user to set different low power consumption modes is desired.

SUMMARY OF THE INVENTION

It is an object of the present invention to provide a semiconductor memory device that decreases power consumption and increases performance.

To achieve the above object, the present invention provides a semiconductor memory device including a plurality of memory cells that undergo refreshing to maintain data. The semiconductor memory device includes a normal operation mode for performing normal operation with the memory cells and a plurality of low power consumption modes for decreasing power consumption when the semiconductor memory device is in a standby state. The semiconductor memory device includes a mode setting circuit for setting one of the low power consumption modes.

In a further perspective, the present invention is a semiconductor memory device. The semiconductor memory device includes a memory core including a plurality of memory cells that undergo refreshing to maintain data. The semiconductor memory device includes a normal operation mode for performing normal operation with the memory cells and a plurality of low power consumption modes for decreasing power consumption when the semiconductor memory device is in a standby state. An internal power supply circuit is connected to the memory core for supplying the memory core with an operational voltage. The plurality of low power consumption modes includes one of a first low power consumption mode and a second low power consumption mode and a third low power consumption mode. The first low power consumption mode stops the refreshing of all of the memory cells and stops the operation of the internal power supply circuit. The second low power consumption mode stops the refreshing of all of the memory cells and continues the operation of the internal power supply circuit. The third low power consumption mode refreshes some of the memory cells and continues the operation of the internal power supply circuit. The semiconductor memory device includes a mode setting circuit for setting one of the low power consumption modes.

In a further perspective, the present invention is a semiconductor memory device. The semiconductor memory device includes a plurality of memory cells arranged in a plurality of memory sections. The memory cells undergo refreshing to maintain data. The semiconductor memory device includes a refresh mode for refreshing the memory cells in at least one of the memory sections. Each of the memory sections have an inherent refreshing characteristic. A selection circuit selects at least one of the memory sections that has the best refreshing characteristic.

In another perspective, the present invention is a semiconductor device. The semiconductor device includes a first semiconductor memory device that does not require data maintaining and a second semiconductor device connected to the first semiconductor memory device. The second semiconductor memory device includes a plurality of memory cells that undergo refreshing to maintain data. The semiconductor memory device includes a normal operation mode for performing normal operation with the memory cells and a plurality of low power consumption modes for decreasing power consumption when the semiconductor memory device is in a standby state. The second semiconductor memory device includes a mode setting circuit that sets one of the low power consumption modes.

In a further perspective, the present invention is a semiconductor memory device. The semiconductor memory device includes a plurality of memory cells that are refreshed to maintain data. The semiconductor memory device includes a normal operation mode for performing normal operation with the memory cells and a plurality of low power consumption modes for decreasing power consumption when the semiconductor memory device is in a standby state. A command decoder receives a command and generates a first program mode signal and a normal operation mode signal based on the command. An entry control circuit is connected to the command decoder for receiving the first program mode signal from the command decoder and generating a program mode entry signal based on the first program mode signal. A mode setting circuit is connected to the entry control circuit to set one of the low power consumption modes in response to the program mode entry signal.

In a further perspective, the present invention is a semiconductor memory device. A plurality of memory cells are refreshed to maintain data. The semiconductor memory device includes a normal operation mode for performing normal operation with the memory cells and a plurality of low power consumption modes for decreasing power consumption when the semiconductor memory device is in a standby state. A mode setting circuit generates a refresh operation mode signal corresponding to one of the low power consumption modes. A refresh control circuit is connected to the mode setting circuit to compare a setting address of the memory cells that are to be refreshed with the refresh counter address in response to the refresh operation mode signal and to generate the refresh signal when the setting address and the refresh counter address match.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2 is a diagram showing state shifting in the semiconductor memory device of FIG. 1;

FIG. 3 is a table showing the states of an internal power supply and a refresh operation during a power down mode;

FIG. 4 is a schematic block diagram of a cellular phone that includes the semiconductor memory device of FIG. 1;

FIG. 8 is a table of commands provided to the semiconductor memory device of FIG. 1;

FIG. 9 is a waveform chart illustrating the mode setting cycle of the semiconductor memory device of FIG. 1;

FIGS. 10A to 10C are tables of mode setting address codes;

FIGS. 15A and 15B are diagrams showing the waveforms of the entry control circuit of FIG. 11A;

FIG. 25 is a diagram illustrating address scramble; and

DETAILED DESCRIPTION OF THE PREFERRED EMBODIMENTS

Figure 1:
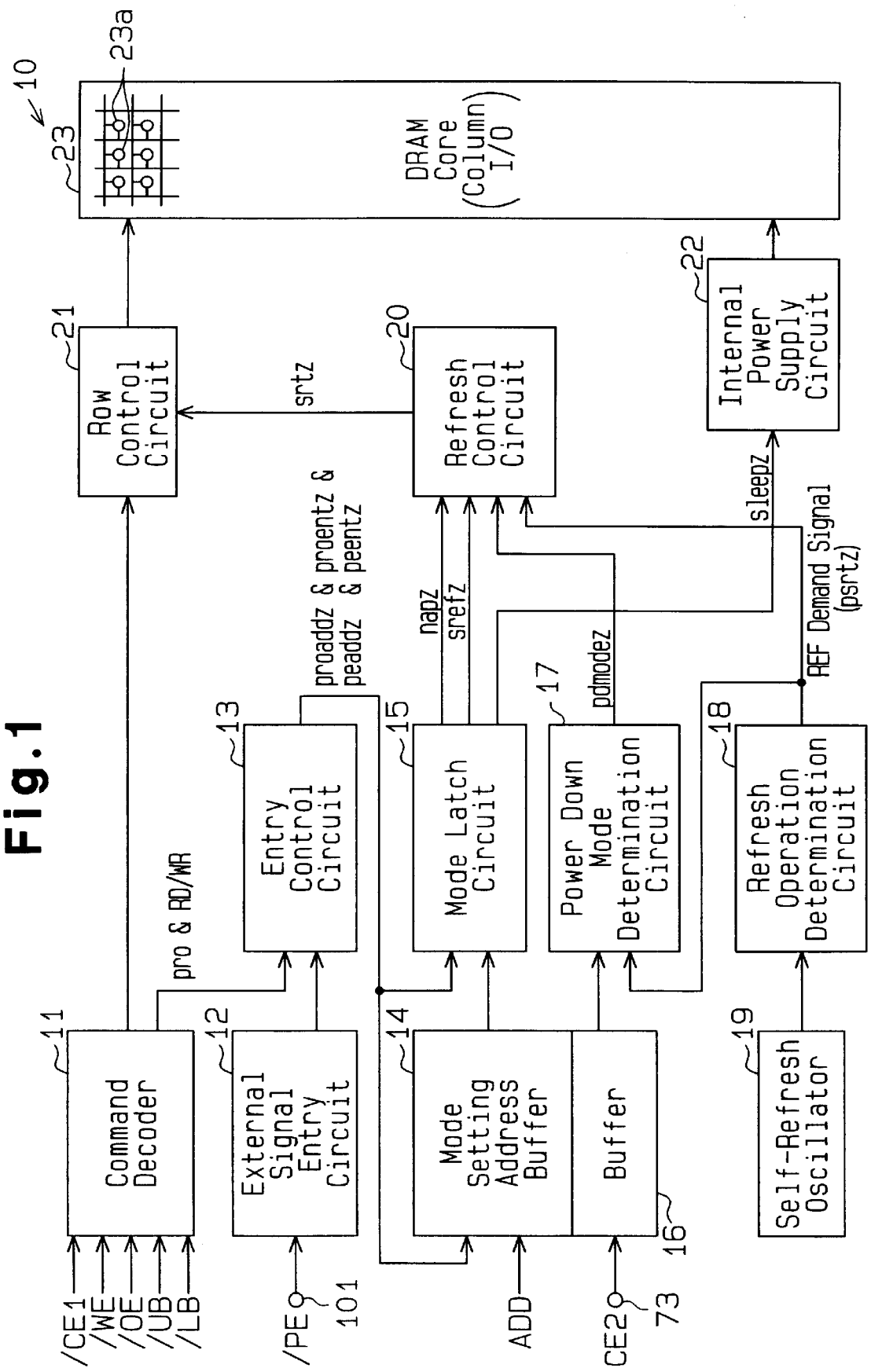
FIG. 1 is a schematic block view of a semiconductor memory device according to a first embodiment of the present invention.

In the drawings, like numeral identifiers are used for like elements throughout.

A semiconductor memory device according to a preferred embodiment of the present invention will now be described with reference to FIGS. 1 to 23.

The semiconductor memory device of the preferred embodiment is a DRAM provided with an SRAM interface.

The DRAM includes a memory core, which has dynamic memory cells for storing information, a row decoder, a column decoder, and a sense amplifier. The DRAM is an asynchronous memory that does not require signals or commands to be provided to an interface connected with an external device to refresh memory cells. Further, the DRAM is provided with a self-refresh function that maintains the information of memory cells during a normal operation mode. Accordingly, the DRAM replaces an SRAM without an additional circuit for performing refreshing.

FIG. 2 is a diagram showing the shifting of states in the semiconductor memory device (DRAM) of the preferred embodiment. The DRAM functions in a normal operation mode, during which normal read and write operations are performed, and a power down mode, during which the power consumption is low. During the power down mode, one of low power consumption modes including a sleep mode, a refresh stop mode (Nap mode), and a partial self-refresh mode (S-Ref mode) is selected. The control of a device internal power supply and the control of memory core refreshing are combined to set each of the power consumption modes.

When the power goes on, the DRAM enters one of the power down modes (in the preferred embodiment, the sleep mode) from a cold start (CST) state and then shifts to a standby mode (STB) of the normal operation mode. The power down mode, which the DRAM enters from the cold start state, may be the Nap mode or the S-Ref mode. The DRAM has a self-refresh function that automatically maintains data in every memory cell section during the normal operation mode.

When a read command or a write command is provided during the standby mode, the DRAM shifts to a read mode (RD) or a write mode (WR) and performs a read operation or a write operation. After performing the read operation or the write operation, the DRAM enters a standby mode or an output disable mode (OD) based on the received command or proceeds from the output disable mode to the standby mode. The DRAM may also shift from the read mode to the write mode based on the received command (read-after-write command).

When a program command is provided during the standby mode, the DRAM shifts to a first program mode (PRO). Further, when the DRAM detects a program mode signal /PE during the standby mode, the DRAM shifts to a second program mode (PE). In the first and second program modes, the DRAM selects one of the low power consumption modes of the power down mode based on a setting code provided from an external device and sets the selected low power consumption mode based on a specific setting code. After the setting is completed, the DRAM automatically shifts to the standby mode.

When the DRAM detects a chip enable signal CE2 during the standby mode, the DRAM immediately enters the selected lower power consumption mode. The power consumption amount and the wait time required for shifting from the power down mode to the normal operation mode differs in each of the low power consumption modes. Accordingly, a user may select the desired power consumption by selecting one of the low power consumption modes. Further, the low power consumption mode is set beforehand during the normal operation mode (program mode). Thus, the DRAM shifts from the normal operation mode to the low power consumption mode within a short period of time from when the chip enable signal CE2 changes.

FIG. 3 is a table showing the internal power supply and refresh operation set in accordance with mode. The DRAM switches the internal power supply circuits and the refresh operation in accordance with each low power consumption mode.

When the chip enable signal CE2, which is provided to a mode terminal of the DRAM, is high, the DRAM functions in the normal operation mode. In the normal operation mode, the DRAM activates all of the internal power supply circuits, each of which is activated during an associated low power consumption mode, and self-refreshes the memory cells of every memory section in the memory core.

The DRAM incorporates, for example, five internal power supply circuits. The first internal power supply circuit provides power to the memory core. The second internal power supply circuit provides power to the peripheral circuits that drive the memory core. The third internal power supply circuit provides power to an external device and an interface. The fourth internal power supply circuit provides power to a circuit for determining the mode, for example, during the power down mode. The fifth internal power supply circuit provides the substrate with a negative potential or a step-up potential.

When the chip enable signal CE2 provided to the mode terminal of the DRAM goes low, the DRAM enters one of the low power consumption modes. The DRAM deactivates the first, second, and fifth internal power supply circuits during the sleep mode and activates these circuits during the Nap mode or the S-Ref mode. The DRAM stops the refresh operation during the sleep mode and the Nap mode and performs a selective refresh operation based on a predetermined program when in the S-Ref mode.

During the sleep mode, the DRAM deactivates some of the internal power supply circuits and stops the refresh operation to further decrease power consumption. However, when the DRAM shifts from the sleep mode to the normal operation mode, a first wait time is required until the reading and writing of data in the memory core is enabled, and a second wait time is required to write data to the memory cells. The first wait time is the time from when the internal power supply circuits are activated to when the memory core is provided with an internal power supply having a predetermined voltage.

In the Nap mode, the DRAM stops the refresh operation and decreases power consumption. In this case, the first wait time is not necessary since the internal power supply circuits are activated. Accordingly, only the second wait time is necessary until the operation of the DRAM is enabled.

In the S-Ref mode, the DRAM performs the self-refresh operation only in predetermined memory sections. Thus, power consumption is decreased compared to when refreshing every memory section. In this case, based on a predetermined program, the DRAM stores data in the memory sections that are to undergo self-refresh during the power down mode. Thus, the time for accessing the DRAM is shortened.

The DRAM 10 of the preferred embodiment will now be discussed with reference to FIG. 1, which shows only the circuits related to the power down mode of the DRAM 10.

The DRAM 10 includes a command decoder 11, an external signal entry circuit 12, an entry control circuit 13, a mode setting address buffer 14, a mode latch circuit 15, a buffer 16, a power down mode determination circuit 17, a refresh operation determination circuit 18, a self-refresh oscillator 19, a refresh control circuit 20, a row control circuit 21, an internal power supply circuit 22, and a DRAM core 23.

The DRAM core 23 includes a memory cell array, a column control circuit, and an input/output (I/O) circuit. The memory cell array has a plurality of memory cells 23a arranged in a matrix-like manner at intersections between word lines and bit lines. The column control circuit selects bit lines, and the I/O circuit inputs and outputs data to and from the memory cells.

An external device provides the command decoder 11 with a first chip enable signal /CE1, a write enable signal /WE, an output enable signal /OE, a higher order bit signal /UB, and a lower order bit signal /LB. The "/" in front of an alphabetic identifier indicates that the signal has negative logic.

The first chip enable signal /CE1 goes low during the read operation or the write operation and activates the DRAM 10. The write enable signal /WE goes low during the write operation and enables the writing of data. The output enable signal /OE goes low during the read operation and enables the output of data. The higher and lower order bit signals /UB, /LB are signals for masking input/output data.

The command decoder 11 decodes these signals and generates various types of commands. When a command for performing normal operation (read/write operation) is generated, the command decoder 11 generates a corresponding read/write signal RD/WR. The command decoder 11 provides the read/write signal RD/WR to the row control circuit 21 and the entry control circuit 13.

When a command for setting the power down mode is generated, the command decoder 11 generates a corresponding first program mode signal Pro and provides the first program mode signal Pro to the entry control circuit 13. The first program mode signal Pro is used to set the entry mode of the DRAM 10 based on the external command.

The combination of signals /CE1, /WE, /OE, /UB, /LB, which disables operations or has no meaning to normal operations (illegal pattern), is used as the command for setting the power down mode. A command formed from such combination is referred to as an illegal command.

When the first chip enable signal /CE1 disables normal operation, the external signal entry circuit 12 amplifies a second program mode signal /PE, which is provided from an external device, and provides the amplified second program mode signal /PE to the entry control circuit 13. More specifically, when the first chip enable signal /CE1 is high, the external signal entry circuit 12 provides the second program mode signal /PE to the entry control circuit 13. The second program mode signal /PE is used to set an entry mode of the DRAM 10 based on the external signal.

The DRAM 10 shifts from the normal operation mode to one of the low power consumption modes of the power down mode in a mode setting cycle determined by an external command or an external command.

Based on the first program mode signal Pro and the read/write signal RD/WR, the entry control circuit 13 generates a first address enable signal proaddz and a first entry signal proentz. The entry control circuit 13 then provides the first address enable signal proaddz and the first entry signal proentz to the mode setting address buffer 14 and the mode latch circuit 15.

More specifically, the entry control circuit 13 counts the number of times the first program mode signal Pro is input and generates the first address enable signal proaddz and the first entry signal proentz when the count value reaches a predetermined value. When the read/write signal RD/WD is provided before the count value reaches the predetermined value, the entry control circuit 13 clears the count value. Accordingly, the entry control circuit 13 generates the first address enable signal proaddz and the first entry signal proentz when the first program mode signal Pro is provided consecutively for the predetermined number of times (i.e., when the command decoder 11 consecutively receives an illegal command for the predetermined number of times). The entry control circuit 13 prevents erroneous entry to a program mode due to noise or the like.

The first program mode signal Pro may be generated when the command decoder 11 consecutively receives an illegal command for the predetermined number of times. In this case, the entry control circuit 13 generates the first address enable signal proaddz and the first entry signal proentz based on the program mode signal Pro.

The entry control circuit 13 generates a second address enable signal peaddz and a second entry signal peentz based on the second program mode signal /PE and provides the second address enable signal peaddz and the second entry signal peentz to the mode setting address buffer 14 and the mode latch circuit 15.

More specifically, the entry control circuit 13 detects whether the second program mode signal /PE has shifted in accordance with a predetermined pattern and generates the address enable signal peaddz and the second entry signal peentz when such shifting has been detected. In the preferred embodiment, the second program mode signal /PE is normally high. When the second program mode signal /PE shifts from high to low and then to high, the second address enable signal peaddz and the second entry signal peentz are generated. The entry control circuit 13 enables entry to the program mode through an external input signal.

Accordingly, the DRAM 10 enters the program modes PRO, PE based on an external command or an external signal from an external terminal 101. Such entry enables the user's requirements to be satisfied.

The mode setting address buffer 14 receives an address signal ADD from an external device and provides an address signal A<0:3>, which is formed from the bits of the address signal ADD required for mode setting (in this case, four bits), to the mode latch circuit 15 in response to first and second address enable signals proaddz, peaddz. Code A<0:3> represents bits A0 to A3 of the address signal ADD.

The mode latch circuit 15 latches the address signal A<0:3> based on the first and second address enable signals proaddz, peaddz and first and second entry signals proentz, peentz and provides a refresh address signal paz<0:3> to the refresh control circuit 20. The refresh address signal paz<0:3> includes information of the memory sections that should undergo selective refreshing during the S-Ref mode.

Further, the mode latch circuit 15 decodes the refresh address signal paz<0:3> and generates a refresh stop mode signal (Nap mode signal) napz, a selective refresh mode signal (S-Ref mode signal) srefz, and a sleep mode signal sleepz.

More specifically, the mode latch circuit 15 latches the address signal A<0:3> as a code in response to the first and second address enable signals proaddz, peaddz. The code includes information of the entry mode and information for setting the operation of the entry mode (memory section selection information during the selective refresh mode).

In the preferred embodiment, address signals A0, A1 are mode selection information and address signals A2, A3 are memory section selection information. Accordingly, in the S-Ref mode, the DRAM 10 divides the DRAM core 23 into four memory sections and selectively refreshes one of the memory sections based on the address signals A2, A3.

The mode latch circuit 15 causes one of the Nap mode signal napz, the S-Ref mode signal srefz, and the sleep mode signal sleepz to go high based on the latched code (mode selection information).

The mode latch circuit 15 provides the Nap mode signal napz and the S-Ref mode signal srefz to the refresh control circuit 20 and provides the sleep mode signal sleepz to the internal power supply circuit 22.

The buffer 16 amplifies a second chip enable signal CE2, which is received from an external device, and provides the amplified second chip enable signal CE2 to the power down mode determination circuit 17. The second chip enable signal CE2 is used for shifting between the normal operation mode and the power down mode. The power down mode determination circuit 17 also receives a refresh demand signal psrtz, which is output from the refresh operation determination circuit 18.

The refresh operation determination circuit 18 generates the refresh demand signal psrtz based on a clock signal CLK output from the self-refresh oscillator 19. The self-refresh oscillator 19 generates a clock signal CLK having a predetermined frequency and provides the clock signal CLK to the refresh operation determination circuit 18. The refresh operation determination circuit 18 divides or counts the clock signal CLK and generates the refresh (REF) demand signal psrtz, which has a predetermined cycle. The refresh demand signal psrtz has a cycle corresponding to the time required to refresh the information of all of the memory cells in the DRAM core 23. The refresh operation determination circuit 18 provides the refresh demand signal psrtz to the power down mode determination circuit 17 and the refresh control circuit 20.

In the S-Ref mode, the refresh demand signal may be changed in accordance with the information maintaining characteristic of the memory cell section in which selective refreshing is to be performed. Further, the refresh demand signal may be changed in the same manner during address scramble, which will be described later.

The power down mode determination circuit 17 determines the mode based on the second chip enable signal CE2 and shifts a power down (PD) mode signal pdmodez to a level corresponding to the determination mode in synchronism with the refresh demand signal psrtz. For example, when shifting from the normal operation mode to the power down mode (when the second chip enable signal CE2 goes low), the power down mode determination circuit 17 causes the PD mode signal pdmodez to go high in synchronism with when the refresh demand signal psrtz goes low. When shifting from the power down mode to the normal operation mode, the power down mode determination circuit 17 causes the PD mode signal pdmodez to go low in synchronism with when the refresh demand signal psrtz goes low. By generating the PD mode signal in this manner, the self-refresh operation that is being performed is prevented from being stopped and thereby damaging the information of the memory cells even if the refresh demand signal psrtz, which is asynchronous to an external device, is generated in the DRAM 10.

In the normal operation mode, the refresh control circuit 20 generates a refresh signal srtz, the pulses of which are substantially the same as the refresh demand signal psrtz, in response to the power down mode signal pdmodez.

The row control circuit 21 activates a word line of the DRAM core 23 selected by a refresh address counter (not shown) in response to the refresh signal srtz, which is provided from the refresh control circuit 20. In this manner, the information of the memory cell connected to the activated word line is refreshed.

In the power down mode, the refresh control circuit 20 generates the refresh signal srtz from the refresh demand signal psrtz based on the Nap mode signal napz, the S-Ref mode signal srefz, and the refresh address signal paz<0:3> in response to the power down mode signal pdmodez.

More specifically, the refresh control circuit 20 causes the refresh signal srtz to go low when the Nap mode signal napz is high. The row control circuit 21 does not activate word lines in response to the low refresh signal srtz. Accordingly, in the Nap mode in which the Nap mode signal napz is high, the refresh of the DRAM core 23 is stopped.

When the S-Ref mode signal srefz is high, the refresh control circuit 20 generates the refresh signal srtz, which has pulses, based on the memory section information of the refresh address signal paz<0:3>. More specifically, when the output of the refresh address counter (i.e., address of the DRAM core 23) matches the section information (address signals A2, A3) of the refresh address signal PAZ<0:3>, the refresh control circuit 20 generates the refresh signal srtz, the pulses of which are substantially the same as the refresh demand signals psrtz. The row control circuit 21 activates word lines in response to the refresh signal srtz. This refreshes the memory cells of the memory sections that are designated by the memory section information (address signals A2, A3).

The internal power supply circuit 22 controls the supply of power to circuits including the DRAM core 23. The internal power supply circuit 22 is activated and deactivated in response to the sleep mode signal sleepz, which is received from the mode latch circuit 15. The activated internal power supply circuit 22 generates internal voltage, which is provided to circuits including the DRAM core 23. The deactivated internal power supply circuit 22 stops generating the internal voltage.

In addition to the internal power supply circuit 22, which is controlled by the sleep mode signal sleepz, the DRAM 10 incorporates an internal power supply circuit that is not controlled by the sleep mode signal sleepz.

FIG. 4 is a schematic block diagram of a cellular phone 30 incorporating the DRAM 10. The cellular phone 30 includes a CPU 31 and an MCP 32, each of which is arranged on a semiconductor circuit substrate. The MCP 32 includes the DRAM 10 and a flash memory 33. The MCP is a multichip package formed from a plurality of chips having different functions like a DRAM and a flash memory.

The CPU 31 controls the writing of data to and the reading of data from the DRAM 10 and the flash memory 33. The DRAM 10 is used as a working memory, and the flash memory 33 is used as a backup memory when the power of the cellular phone 30 is turned off or when the cellular phone 30 is in the standby mode.

Figure 5:
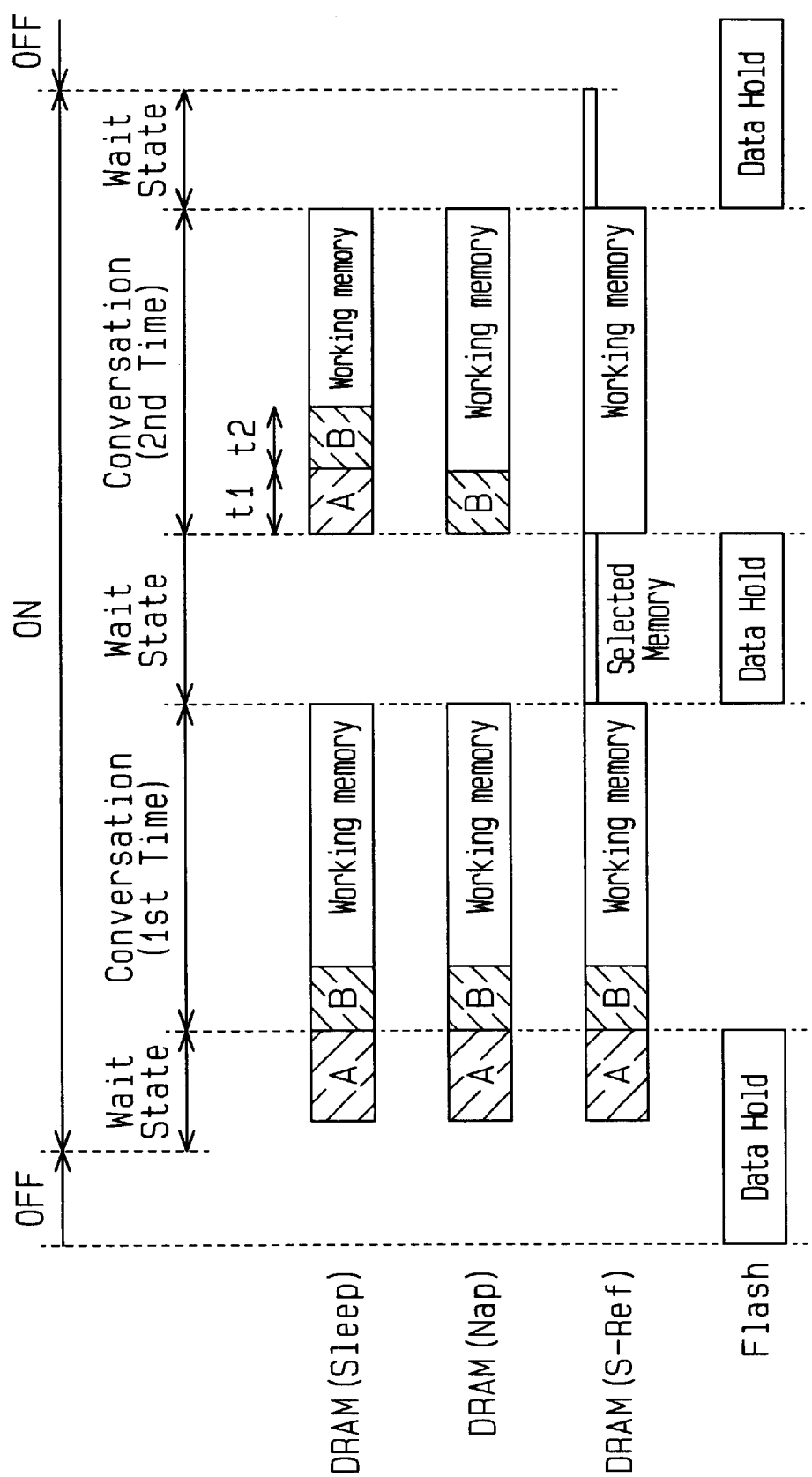
FIG. 5 is a chart illustrating the operation of the cellular phone of FIG. 4.

FIG. 5 is a chart illustrating the operation of the cellular phone 30.

The CPU 31 transfers the necessary data from the DRAM 10 to the flash memory 33 when turning off the power of the cellular phone 30.

The cellular phone 30 enters the standby mode when the power is turned on. In this state, the CPU 31 sets the DRAM 10 in one of the low power consumption modes. When the DRAM 10 is in the sleep mode, the power consumed by the DRAM 10 is substantially the same as the power consumed by the flash memory 33 in the standby mode. The necessary data is stored in the flash memory 33.

Subsequently, when the cellular phone 30 shifts from the standby mode to a conversation mode, the CPU 31 causes the chip enable signal CE2 to go high. After the DRAM 10 enters the standby mode (FIG. 2), the CPU 31 transfers the data stored in the flash memory 33. Conversation includes the transmission of data.

When shifting from the conversation mode to the standby mode, the CPU 31 saves the necessary data of the DRAM 10 in the flash memory 33. Then, the CPU 31 causes the chip enable signal CE2 to go low and shifts the DRAM 10 to the power down mode. When the power down mode is set in the sleep mode or the Nap mode, the DRAM 10 does not perform the refresh operation. Thus, all of the data in the DRAM 10 is erased. When the power down mode is set to the S-Ref mode, the refresh operation is performed on the selected memory sections. Thus, the DRAM 10 maintains necessary data and erases unnecessary data. This decreases power consumption in the standby mode of the cellular phone 30.

When the cellular phone 30 shifts from the standby mode to the conversation mode, the CPU 31 causes the chip enable signal CE2 to go high. As a result, the DRAM 10 enters the standby mode. In this state, when the DRAM 10 shifts from the sleep mode to the normal operation mode, the DRAM 10 activates the internal power supply circuit 22 and restarts supplying power to the DRAM core 23. After time t1 elapses from when the supply of power is started, the CPU 31 transfers the data stored in the flash memory 33 to the DRAM 10. Time t2 is required for the data transmission. Accordingly, time t1+t2 is required to enable conversation in the sleep mode. However, in this case, the internal power supply circuit 22 is deactivated in the sleep mode. Thus, the power consumption decreasing effect is high.

When the DRAM 10 shifts from the Nap mode to the normal operation mode, the internal power supply circuit 22 has already been activated. Thus, the CPU 31 immediately transfers the data stored in the flash memory 33 to the DRAM 10. Time t2 is required for the data transmission. Accordingly, the power consumption in the Nap mode is less than that when maintaining all of the data in the DRAM 10. Since time t1 is not necessary, the performance of the cellular phone is improved compared to the sleep mode.

When the DRAM 10 shifts from the S-Ref mode to the normal operation mode, only the necessary data is maintained in the DRAM 10. Thus, conversation is immediately enabled. Accordingly, in the S-Ref mode, the performance of the cellular phone 30 substantially remains the same since the wait time between the standby mode and the conversation mode is null (or substantially null). Thus, by selecting the appropriate low power consumption mode, the power consumption decreasing effect and the performance of the cellular phone 30 are improved.

An exclusive memory controller may be used in lieu of the CPU 31 to control the DRAM 10 and the flash memory 33. Further, the transmission of data is not limited to when shifting between the standby and conversation modes and may be performed during a conversation when necessary. Further, an SRAM may be used as the data backup memory instead of the flash memory 33. Further, in the standby mode, data may be saved in a server of a local base or the like of the cellular phone 30.

Figure 6:
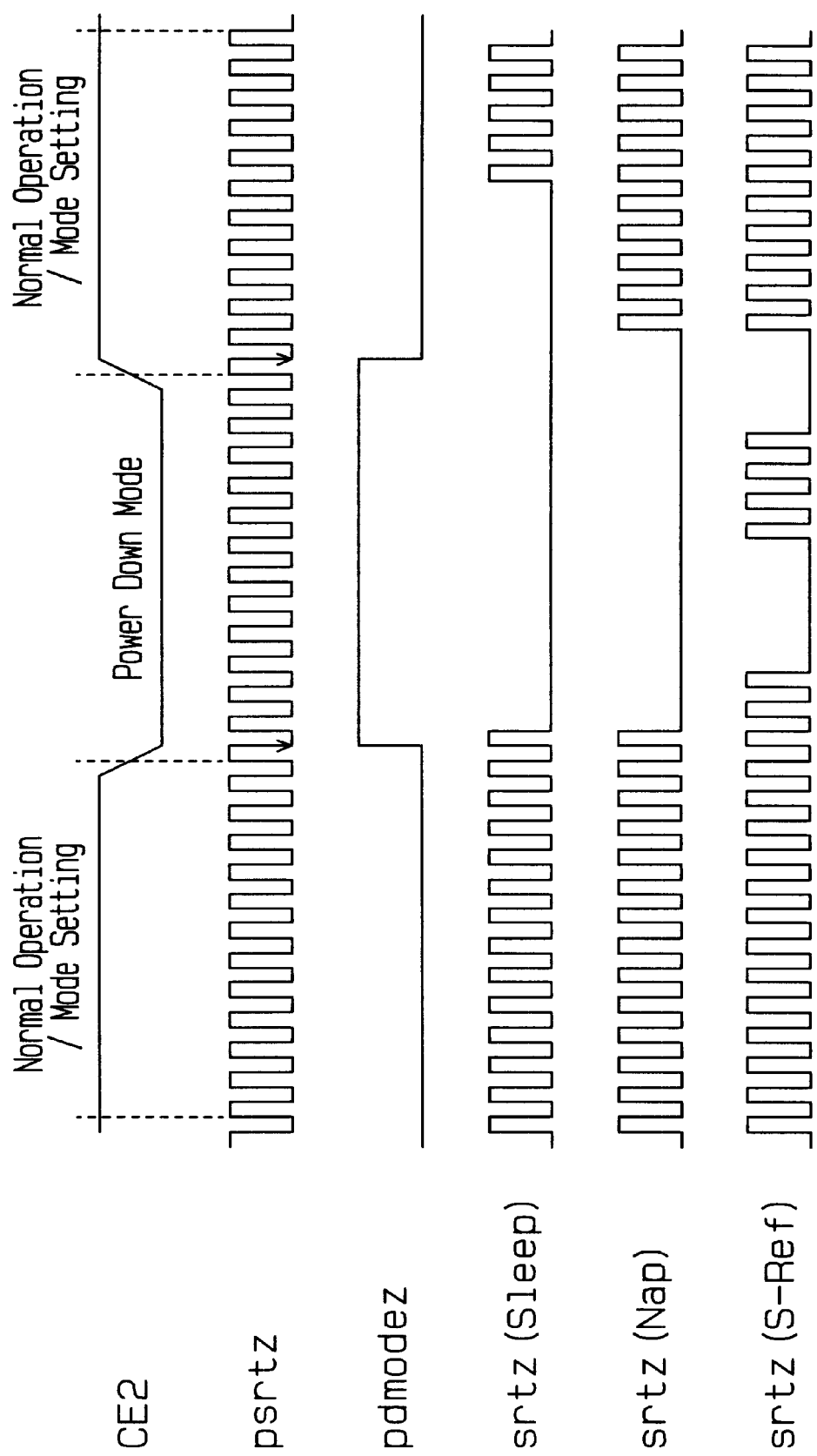
FIG. 6 is a waveform chart illustrating the shifting of modes in the semiconductor memory device of FIG. 1.

FIG. 6 is a waveform chart illustrating the shifting of modes.

The DRAM 10 controls shifting between the normal operation mode and the power down mode based on the second chip enable signal CE2, which is provided to the mode terminal. By setting the next power down mode during the normal operation mode, the time required to shift from the normal operation mode to the power down mode is decreased.

The DRAM 10 determines the mode in response to the refresh demand signal psrtz. The determination is performed to prevent erroneous refreshing that is caused when the second chip enable signal CE2 and the refresh demand signal psrtz are asynchronous to each other. That is, if the mode is shifted to the power down mode when the DRAM core 23 is being refreshed in response to the refresh demand signal psrtz during the normal operation mode, the refreshing may be interrupted and information may be erased.

The DRAM 10 maintains the mode setting information when exiting the power down mode (power down mode exit). By first setting the mode in the normal operation mode, the maintaining of the mode setting information eliminates the burden for resetting the mode. The mode setting information may be automatically set to a default value during the power down mode exit. In this case, the default value may be variable. Such setting eliminates the burden for resetting the mode to the original mode when the system temporarily changes the low power consumption mode.

Figure 7:
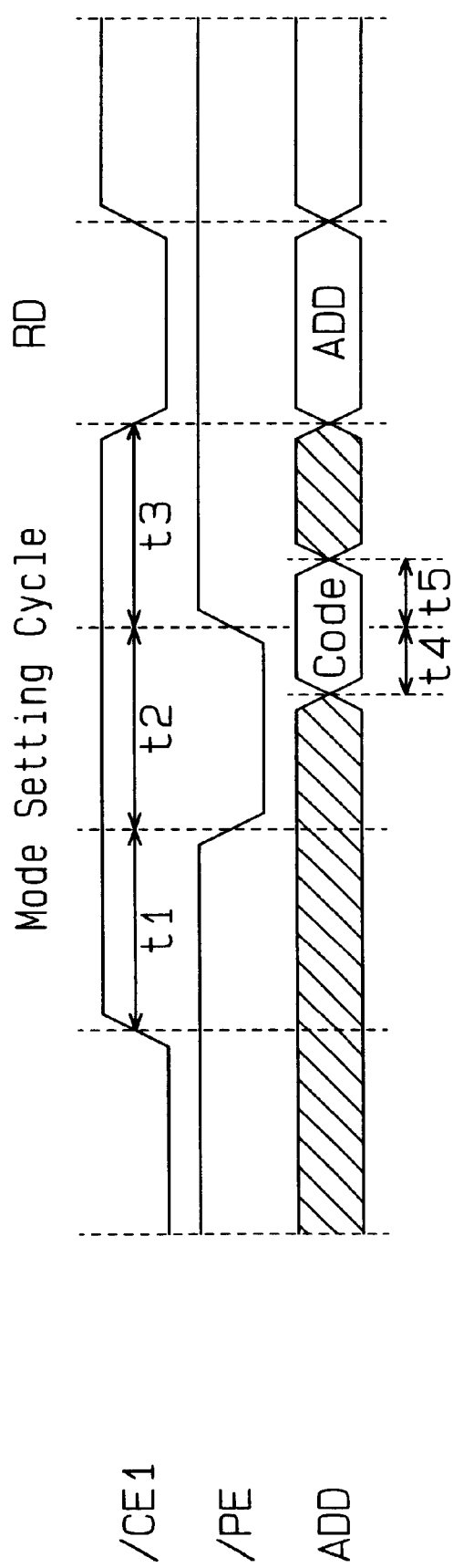
FIG. 7 is a waveform chart illustrating a mode setting cycle of the semiconductor memory device of FIG. 1.

FIG. 7 is a waveform chart illustrating the mode setting cycle.

The DRAM 10 receives the data required for the power down mode via a mode setting external terminal 101. By receiving the information in such manner, safe operation during the normal operation mode is guaranteed.

More specifically, the DRAM 10 does not perform normal operation when the first chip enable signal /CE1 is high. The DRAM 10 acquires the address code based on the address signal ADD in response to the second program mode signal /PE, which is provided to the exclusive terminal 101, when the first chip enable signal /CE1 is high. In other words, the DRAM 10 activates the address code input circuit when the second program mode signal /PE goes low and latches the address code information when the second program mode signal /PE goes high.

The DRAM 10 acquires the address signal ADD based on the read command when the first chip enable signal /CE1 is low.

In FIG. 7, t1 to t5 are external specification timing conditions.

In the timing of FIG. 7, an input circuit (not shown) connected to an external exclusive terminal is activated when the second program mode signal /PE goes low. This starts a decoding process of the address signal. When the second program mode signal /PE goes high, the decoding result is determined and the input circuit is deactivated. By selectively activating the input circuit in this manner, power consumption is decreased. In the mode setting cycle, the logic level of the second program mode signal may be inverted. Further, the address code may be provided to a data terminal (DQ).

FIG. 8 is a table of commands. Commands C1 to C6 and C8 to C10 are used during the normal operation mode. Commands C7, C11 have no meaning in the normal operation mode. Although command C7 is used during the write (WR) operation, the signals /LB, /UB are high, and data is thus not input (i.e., data is masked). Command C11 is used during the read (RD) operation. However, data is not output because data is masked by the signals /LB, /UB.

In this manner, by acquiring commands that are not used in the normal operation mode (illegal command) as information required for the power down mode, an exclusive terminal does not have to be employed to set mode information.

FIG. 9 is a waveform chart illustrating a mode setting cycle. FIG. 9 illustrates an example of when information required for mode setting is acquired as an address code by continuously inputting a plurality of commands 11 of FIG. 8.

The DRAM 10 acquires the address signal ADD as an address code in response to command C11. The acquisition of the address code is repeated for an N number of times. When every one of the N number of the address codes acquired in response to the first command to the Nth command match, the DRAM 10 determines that the address code is valid and sets the modes. The mode may also be set if matching is confirmed for an N−1 number of times of command C11. Further, the number of times for acquiring the address code may be changed as required (e.g., one time).

FIGS. 10A to 10C are tables of mode setting address codes. Address signals A0 to A3 are acquired as the address code, and mode setting is performed based on the address code.

The DRAM 10 selects the low power consumption mode based on the address signals A0, A1, which function as the address code, and sets the operation of the mode based on the address signals A2, A3 (e.g., refresh block sections in the S-Ref mode).

More specifically, the Nap mode is set when the address signals A0, A1 are both low (0). The S-Ref mode is set when the address signal A0 is low and the address signal A1 is high (1). The sleep mode is set when the address signals A0, A1 are both high. Further, block section #00 is designated when the address signals A2, A3 are both low. Block section #10 is designated when the address signal A2 is low and the address signal A3 is high. Block section #01 is designated when the address signal A2 is high and the address signal A3 is low. Block section #11 is designated when the address signals A2, A3 are both high.

The block section does not have to be divided into four and may be divided into two or eight as required. Further, a plurality of memory sections may be simultaneously designated. For example, when refreshing one half of the memory sections, two of one-fourth memory sections may be designated. This enables various desires to be satisfied and improves the performance of the system.

The entry control circuit 13, the mode latch circuit 15, the power down mode determination circuit 17, and the refresh control circuit 20 will now be discussed with reference to FIGS. 11 to 23.

Figure 11A:
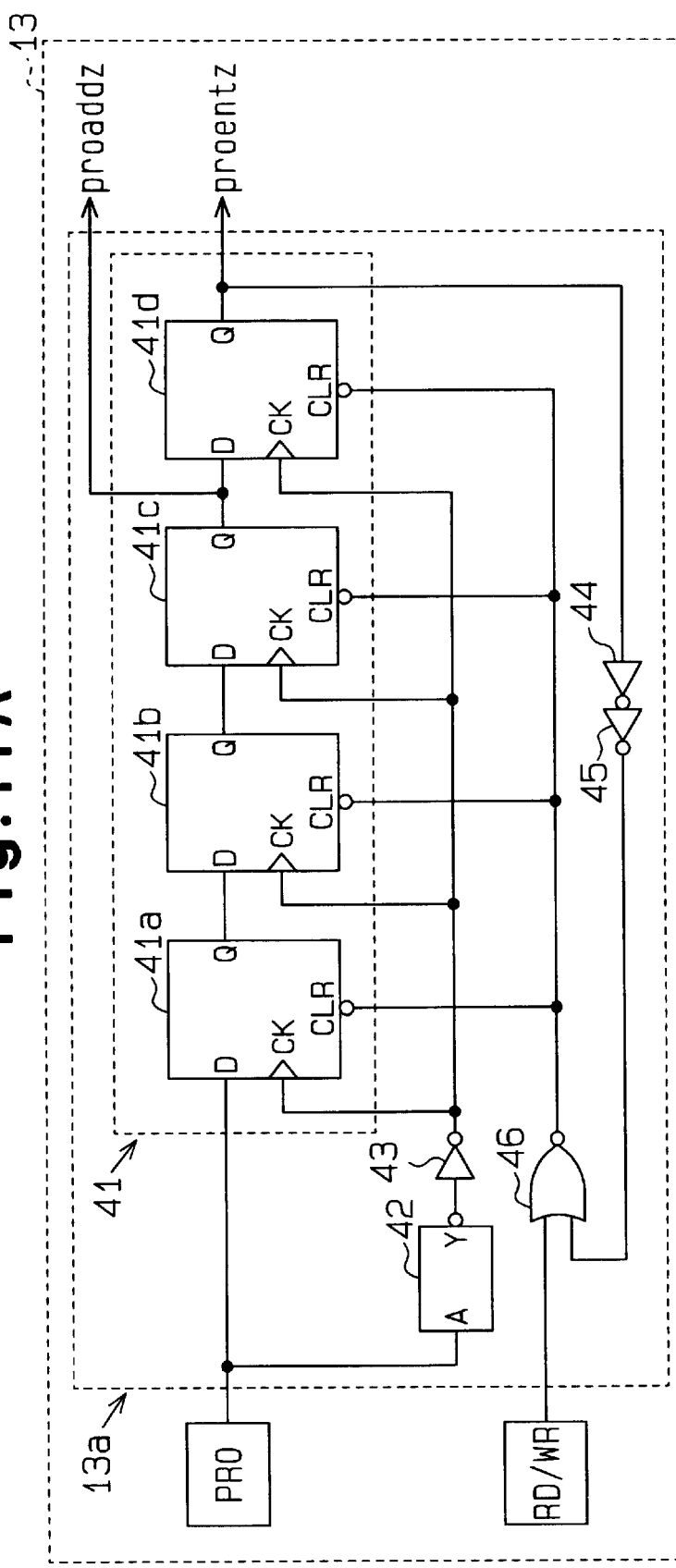
FIG. 11A is a schematic circuit diagram of an entry control circuit of the semiconductor memory device of FIG. 1.

FIG. 11A is a schematic circuit diagram of the entry control circuit 13. The entry control circuit 13 includes a first entry circuit 13a and a second entry circuit 13b. The first entry circuit 13a generates the first address enable signal proaddz and the first entry signal proentz based on the first program mode signal PRO and the read/write signal RD/WR. The second entry circuit 13b generates the second address enable signal peaddz and the second entry signal peentz based on the second program mode signal /PE.

The first entry circuit 13a includes a counter circuit 41, a pulse generation circuit 42, inverter circuits 43, 44, 45, and a NOR circuit 46. The first program mode signal PRO is provided to the counter circuit 41 and the pulse generation circuit 42.

Figure 11B:
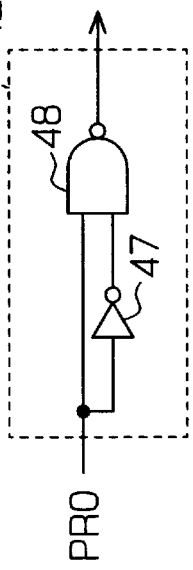
FIG. 11B is a schematic circuit diagram of a pulse generation circuit of the entry control circuit.

As shown in FIG. 11B, the pulse generation circuit 42 includes an inverter circuit 47 and a NAND circuit 48. The first program mode signal PRO is provided to the inverter circuit 47 and a first input terminal of the NAND circuit 48. The output signal of the inverter circuit 47 is provided to a second input terminal of the NAND circuit 48. The number of inverter circuits is not limited as long as the number is odd.

The pulse generation circuit 42 generates a one shot pulse signal, which has a predetermined pulse width, at a low level in response to the rising edge of the first program mode signal PRO. The inverter circuit 43 receives the pulse signal from the pulse generation circuit 42 and provides the counter circuit 41 with a logic signal, which is the inverted version of the pulse signal.

The counter circuit 41 includes four flip-flop circuits 41a, 41b, 41c, and 41d. The output terminal of each of the flip-flop circuits 41a to 41c are connected to the data input terminal of the adjacent flip-flop circuits 41b–41d. The data input terminal of the first stage flip-flop circuit 41a is provided with the first program mode signal PRO. The clock terminal of each of the flip-flop circuits 41a–41d is provided with the output signal of the inverter circuit 43. The output terminal of the third stage flip-flop circuit 41c outputs the first address enable signal proaddz, and the output terminal of the final state (fourth stage) flip-flop circuit 41d outputs the first entry signal proentz.

The first entry signal proentz is provided to a first input terminal of the NOR circuit 46 via the inverter circuits 44, 45. A second input terminal of the NOR circuit 46 is provided with a read/write signal RD/WR. The output signal of the NOR circuit 46 is provided to the clear terminal of each of the flip-flop circuits 41a–41d.

The second entry circuit 13b includes inverter circuits 51, 52 and a pulse generation circuit 53. The external signal entry circuit 12 provides an external terminal 54 with the second program mode signal /PE, which is further provided to the inverter circuit 51 and the pulse generation circuit 53.

The inverter circuit 51 inverts the second program mode signal /PE and generates the second address enable signal peaddz. The pulse generation circuit 53 has the same structure as the pulse generation circuit 42 and provides the inverter circuit 52 with a one shot pulse signal, which has a predetermined pulse width, when the second program mode signal /PE goes high. The inverter circuit 52 inverts the pulse signal and generates the second entry signal peentz.

FIGS. 15A and 15B are diagrams showing the waveforms of the first entry circuit 13a of the entry control circuit 13, which functions as a program mode setting circuit.

Referring to FIG. 15A, the first entry circuit 13a causes the first address enable signal proaddz to go high in the third cycle and causes the first entry signal proentz to go high in the fourth cycle. The first entry circuit 13a simultaneously resets the first address enable signal proaddz and the first entry signal proentz.

Referring to FIG. 15B, the first entry circuit 13a resets the count value when receiving a read command RD (read/write signal RD/WR) and maintains the first enable signal proaddz and the first entry signal proentz at a low level.

Figure 16:
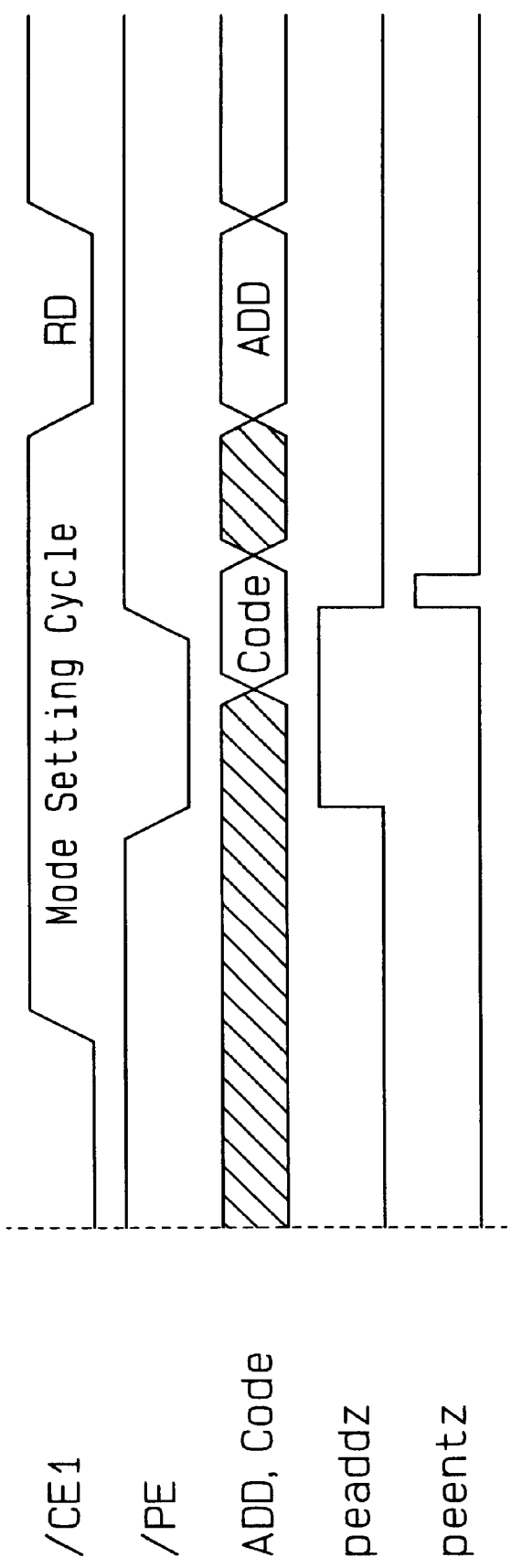
FIG. 16 is a diagram showing the waveform of the entry control circuit of FIG. 11A.
Figure 17:
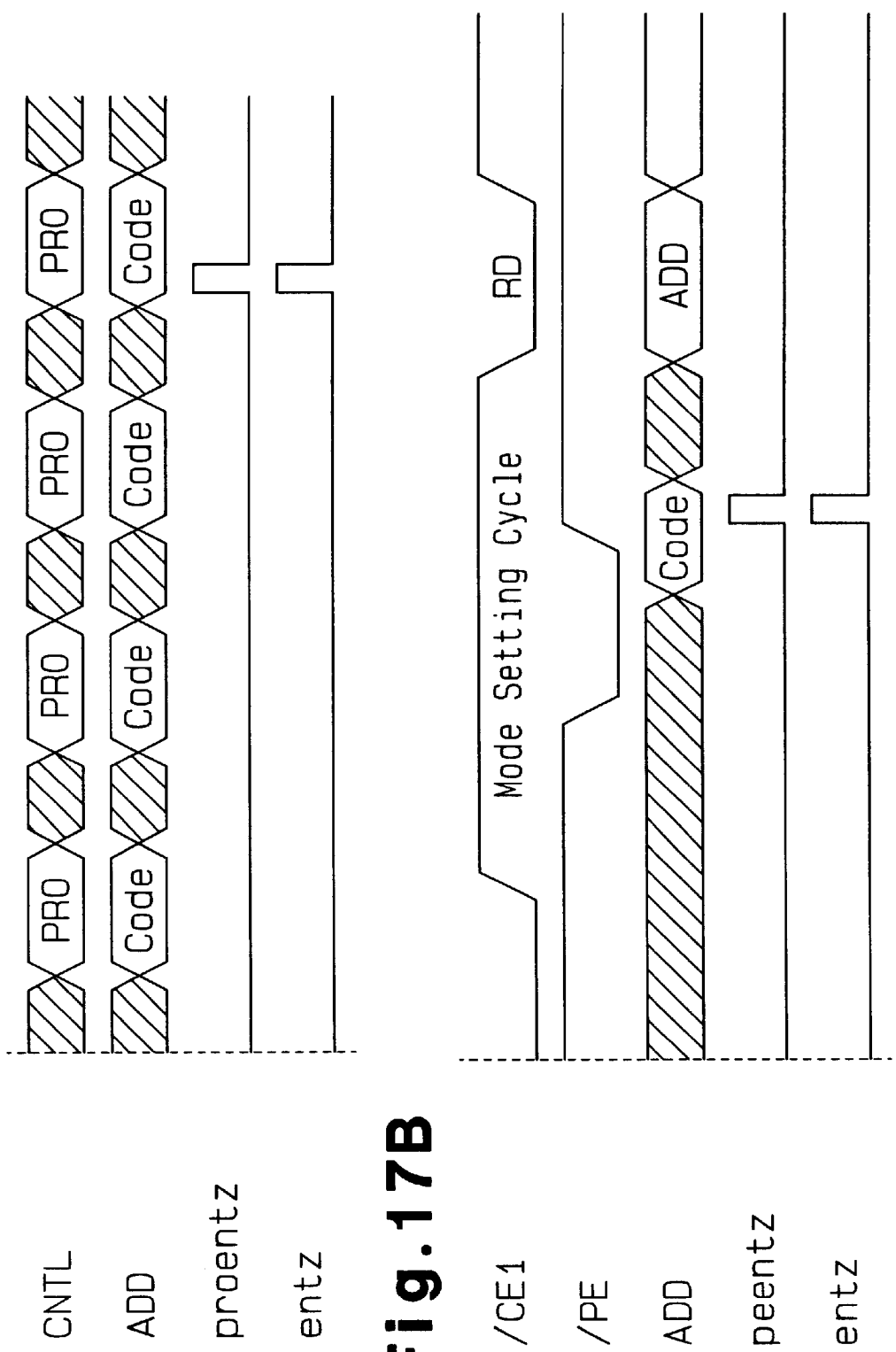
FIGS. 17A and 17B are diagrams showing the waveforms of a synthesized entry signal generation circuit of the mode latch circuit of FIG. 12.

FIG. 16 is a diagram showing the waveform of the second entry circuit 13b of the entry control circuit 13, which functions as the program mode setting circuit.

The second entry circuit 13b generates the second address enable signal peaddz at a high level when the second program mode signal /PE goes low. Then, the second entry circuit 13b generates the second entry signal peentz at a high level when the second program mode signal /PE goes high.

Figure 12:
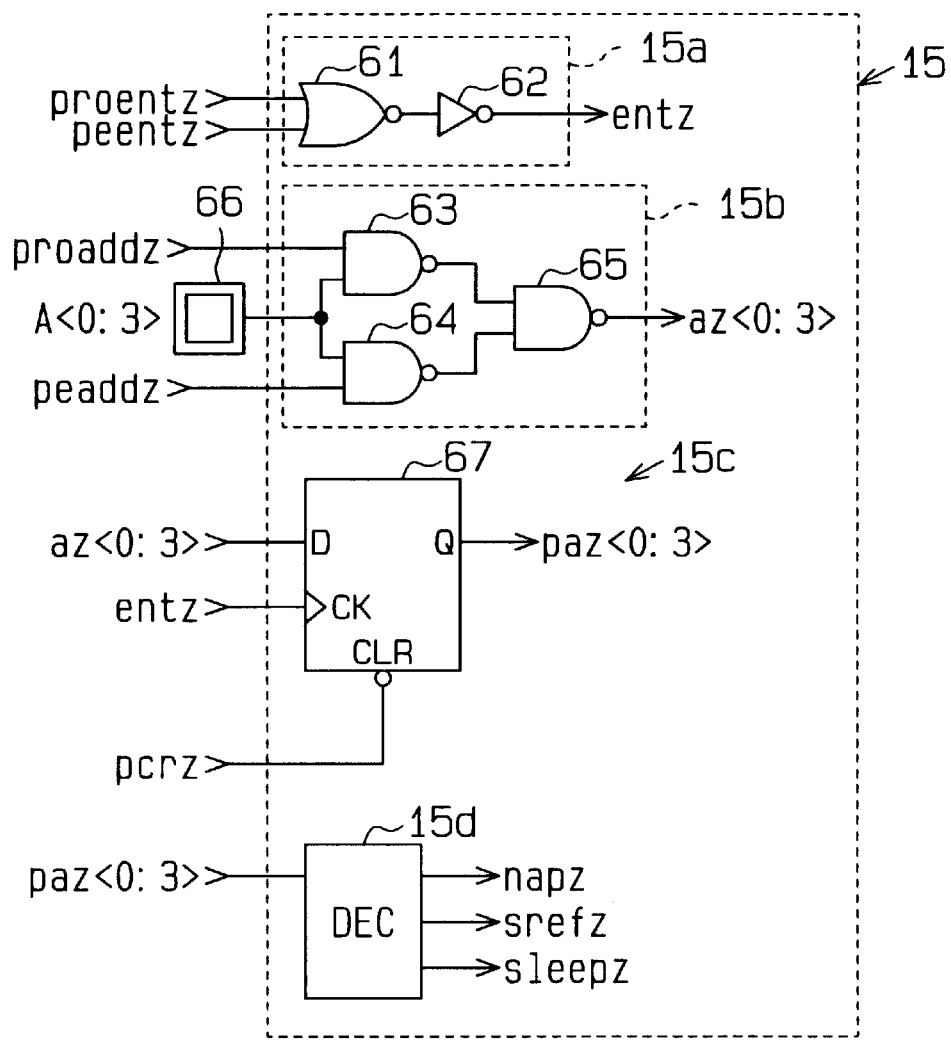
FIG. 12 is a schematic circuit diagram of a mode latch circuit of the semiconductor memory device of FIG. 1.

FIG. 12 is a schematic circuit diagram of the mode latch circuit 15. The mode latch circuit 15 includes a synthesized entry signal generation circuit 15a, a mode setting address buffer 15b, a mode setting address latch 15c, and a mode setting decoder 15d.

The synthesized entry signal generation circuit 15a includes a NOR circuit 61 and an inverter circuit 62. The NOR circuit 61 is provided with the first entry signal proentz and the second entry signal peentz. The output terminal of the NOR circuit 61 is connected to the input terminal of the inverter circuit 62. The inverter circuit 62 outputs a synthesized signal entz.

Referring to FIG. 17A, the synthesized entry signal generation circuit 15a generates the synthesized signal entz in response to the first entry signal proentz. Further, referring to FIG. 17B, the synthesized entry signal generation circuit 15a generates the synthesized signal entz in response to the second entry signal peentz.

Returning to FIG. 12, the mode setting address buffer 15b includes three NAND circuits 63, 64, 65. The first NAND circuit 63 is provided with the first address enable signal proaddz and the address signal A<0:3>, which is received by an external terminal 66. The second NAND circuit 64 is provided with the address signal A<0:3> and the second address enable signal peaddz. The output signals of the first and second NAND circuits 63, 64 are provided to the third NAND circuit 65. The third NAND circuit 65 outputs an address signal az<0:3>. The mode setting address buffer 15b corresponds to the mode setting address buffer 14 of FIG. 1.

Figure 18:
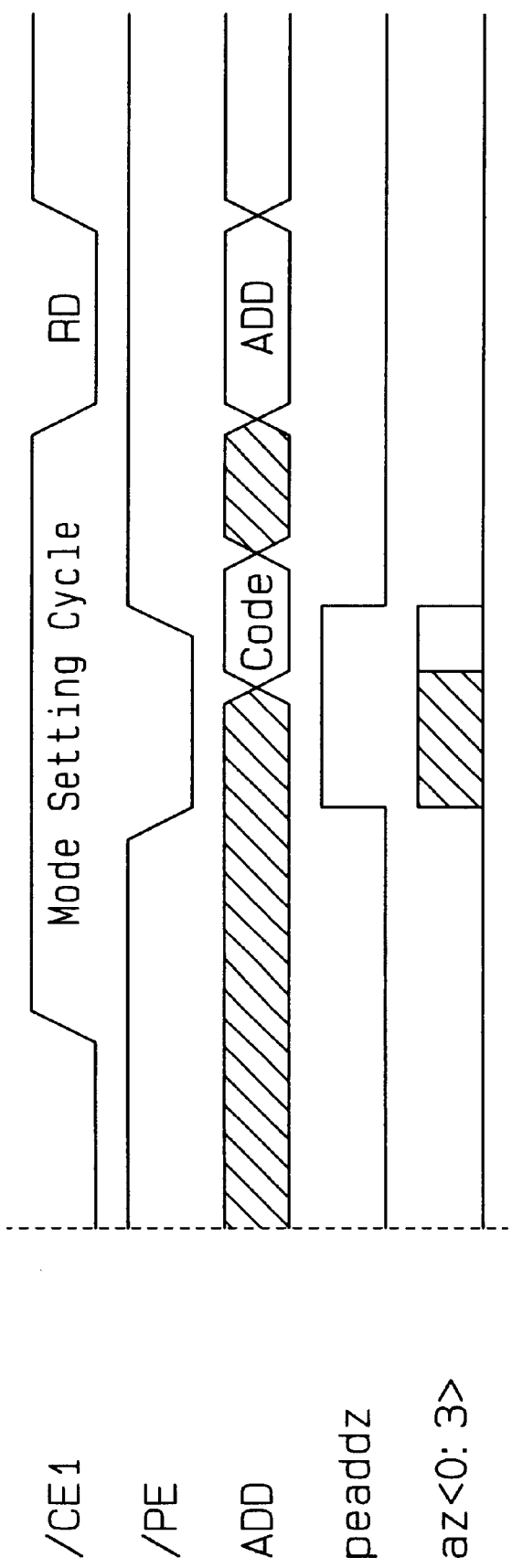
FIG. 18 is a diagram showing the waveform of a mode setting address buffer of the mode latch circuit of FIG. 12.

FIG. 18 is a waveform diagram showing the operation of the mode setting address buffer 15b. The address buffer 15b activates the input circuit when the second address enable signal peaddz goes high and outputs the address signal az<0:3>. Further, the address buffer 15b outputs the address signal az<0:3> in the same manner in response to the first address enable signal proaddz.

Returning to FIG. 12, the mode setting address latch 15c includes flip-flop circuits 67 (only one flip-flop circuit is shown in the drawing), the number of which corresponds to the bit number of the address signal az<0:3>. The flip-flop circuit 67 has a data terminal provided with the address signal az<0:3>, a clock terminal provided with the synthesized signal entz, and a clear terminal provided with a clear signal pcrz. Accordingly, the flip-flop circuit 67 latches the address signal az<0:3> in response to the synthesized signal entz and outputs a refresh address signal paz<0:3>.

Figure 19:
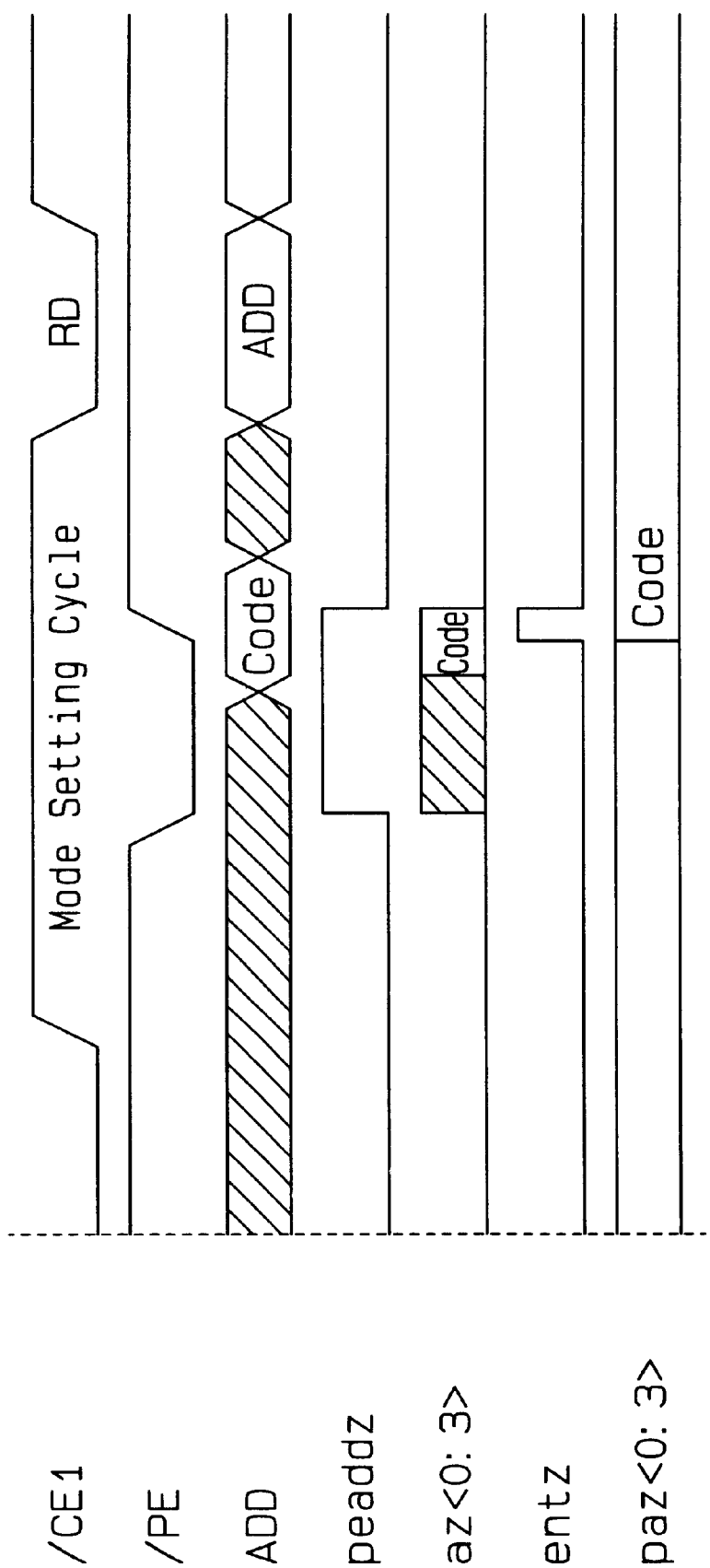
FIG. 19 is a diagram showing the waveform of a mode setting address buffer of the mode latch circuit of FIG. 12.

FIG. 19 is a waveform chart showing the operation of the mode setting address latch 15c. The address latch 15c latches the address signal az<0:3> as a code in response to the synthesized signal entz and outputs the latched code as a refresh address signal paz<0:3>. The address latch 15c outputs the refresh address signal paz<0:3> in the same manner in response to the first address enable signal proaddz.

Returning to FIG. 12, the mode setting decoder 15d decodes the refresh address signal paz<0:3> and outputs the Nap mode signal napz, the S-Ref mode signal srefz, and the sleep mode signal sleepz.

Figure 20:
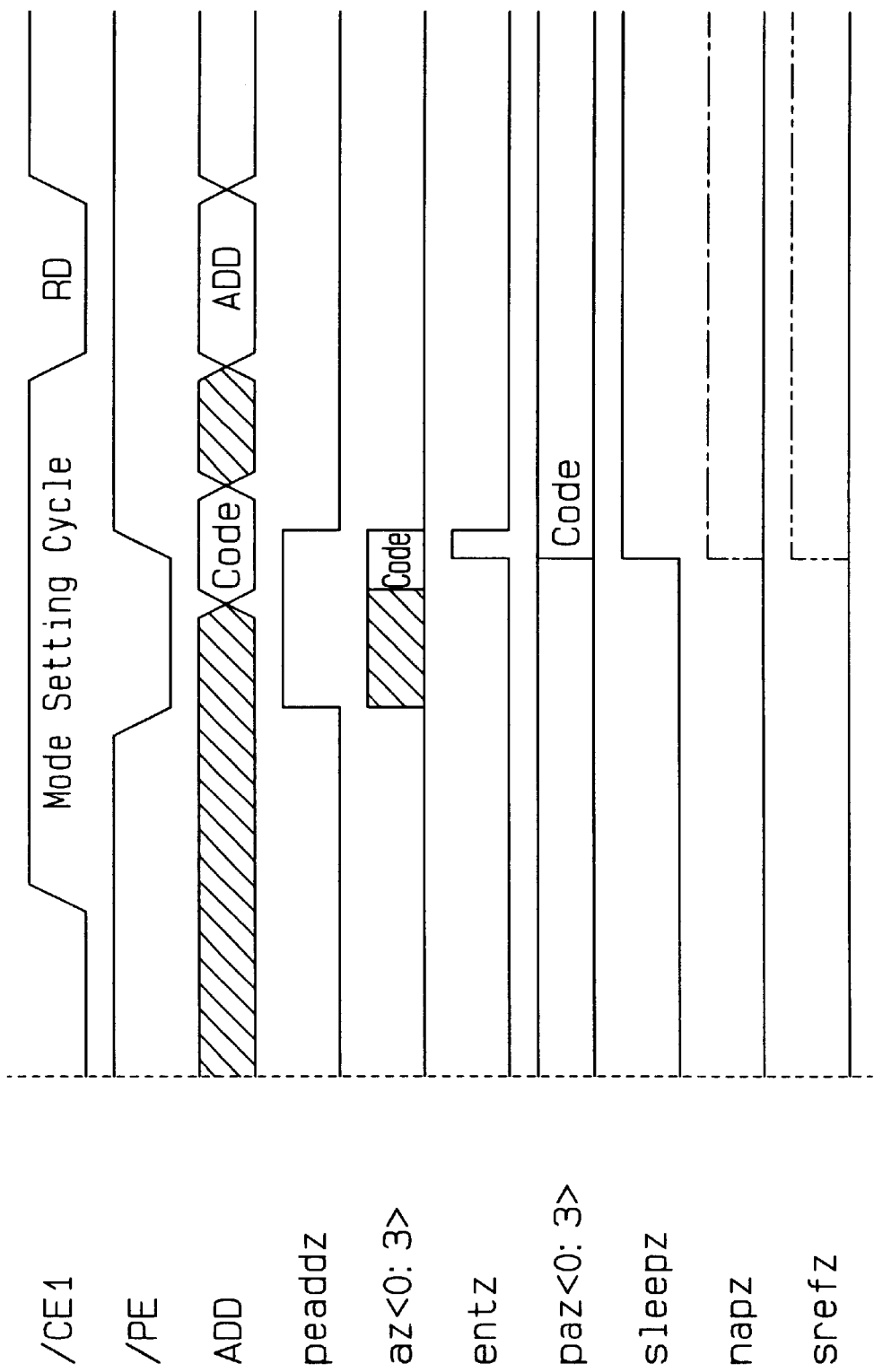
FIG. 20 is a diagram showing the waveform of a mode setting decoder of the mode latch circuit of FIG. 12.

FIG. 20 is a waveform chart showing the operation of the mode setting decoder 15d. The decoder 15d decodes the refresh address signal paz<0:3>, selects one of the mode signals sleepz, napz, srefz (in FIG. 20, the sleep mode signal sleepz), and generates the mode signal at a high level.

Figure 13:
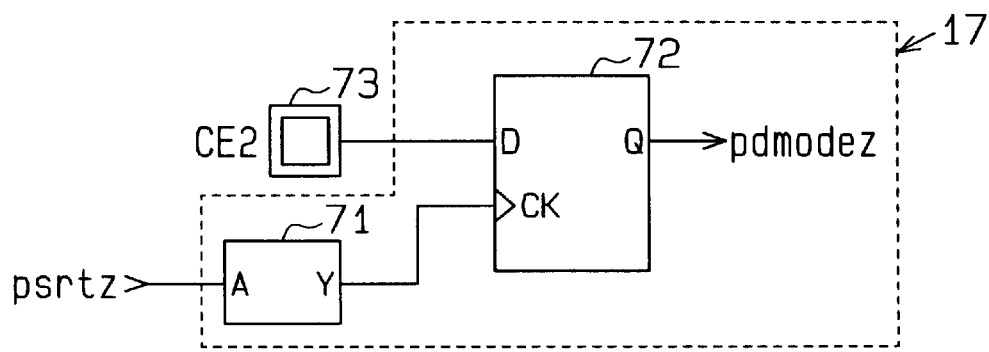
FIG. 13 is a schematic circuit diagram of a power down mode determination circuit of the semiconductor memory device of FIG. 1.

FIG. 13 is a schematic circuit diagram of the power down mode determination circuit 17. The power down mode determination circuit 17 includes a pulse generation circuit 71 and a flip-flop circuit 72. The pulse generation circuit 71 has the same structure as the pulse generation circuit 42 and generates a one shot pulse signal, which has a predetermined pulse width, at a high level in response to the trailing edge of the refresh demand signal psrtz.

The buffer circuit 16 of FIG. 1 provides the data input terminal of the flip-flop circuit 72 with the second chip enable signal CE2 via an external terminal 73. The flip-flop circuit 72 latches the second chip enable signal CE2 in response to the pulse signal from the pulse generation circuit 71 and generates the power down mode signal pdmodez.

Figure 21:
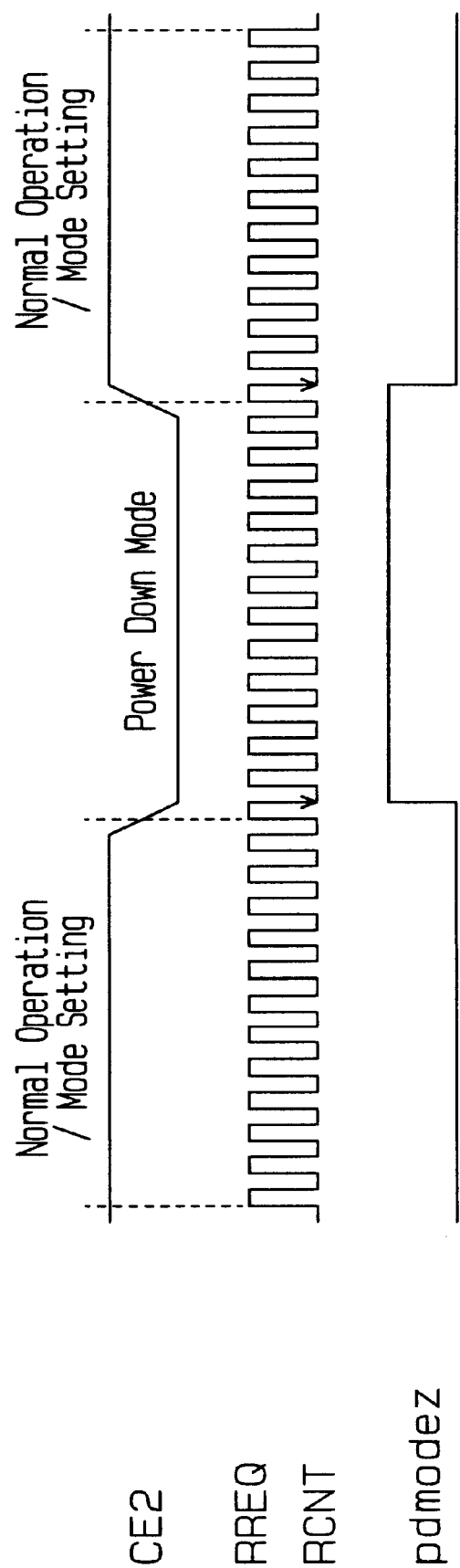
FIG. 21 is a diagram showing the waveform of the power down mode determination circuit of FIG. 13.

FIG. 21 is a waveform chart illustrating the operation of the power down mode determination circuit 17. The power down mode determination circuit 17 latches the second chip enable signal CE2 when the refresh demand signal psrtz goes low and generates the power down mode signal pdmodez.

Figure 14:
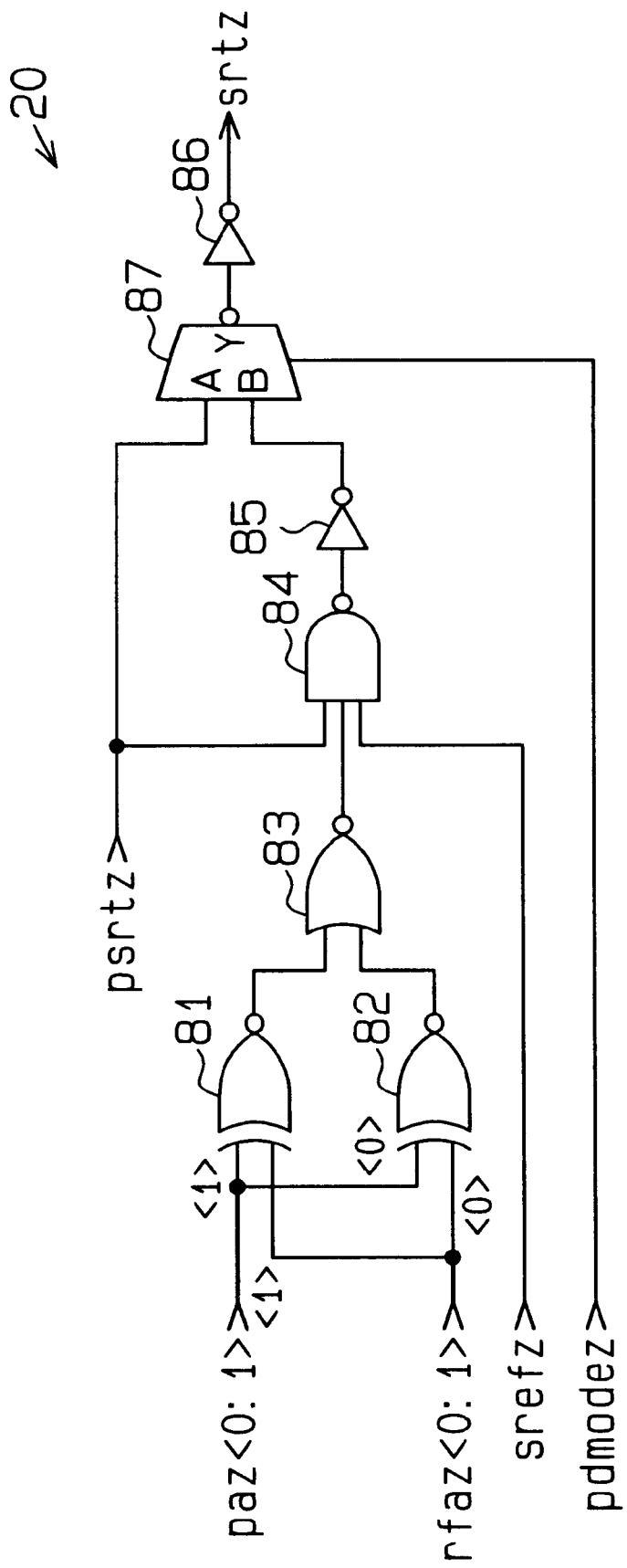
FIG. 14 is a schematic circuit diagram of a refresh control circuit of the semiconductor memory device of FIG. 1.

FIG. 14 is a schematic circuit diagram of the refresh control circuit 20. The refresh control circuit 20 includes EOR circuits 81, 82, a NOR circuit 83, a NAND circuit 84, inverter circuits 85, 86, and a selector 87. The EOR circuit 81 is provided with a refresh address signal paz<1> and a refresh address counter signal rfaz<1>, and the EOR circuit 82 is provided with a refresh address signal paz<0> and a refresh address counter signal rfaz<0>. The two output terminals of the EOR circuits 81, 82 are each connected to the two input terminals of the NOR circuit 83. When the refresh address signal paz<1> and the refresh address counter signal rfaz<1> match, the EOR circuit 81 generates a determination signal at a high level. When the refresh address signal paz<0> and the refresh address counter signal rfaz<0> match, the EOR circuit 82 generates a determination signal at a high level.

The output terminal of the NOR circuit 83 is connected to a first input terminal of the NAND circuit 84. A second input terminal and a third input terminal of the NAND circuit 84 are respectively provided with the refresh demand signal psrtz and the S-Ref signal srefz. The output terminal of the NAND circuit 84 is connected to an input terminal B of the selector 87 via an inverter circuit 85. An input terminal A of the selector 87 is provided with the refresh demand signal psrtz. The selector 87 inverts the refresh demand signal psrtz or the output signal of the inverter circuit 85 in response to the power down mode signal pdmodez, which is received by a selection terminal. Then, the selector 87 provides the inverted output signal to the inverter circuit 86. The inverter circuit 86 further inverts the inverted output signal and generates the refresh signal srtz.

Figure 22:
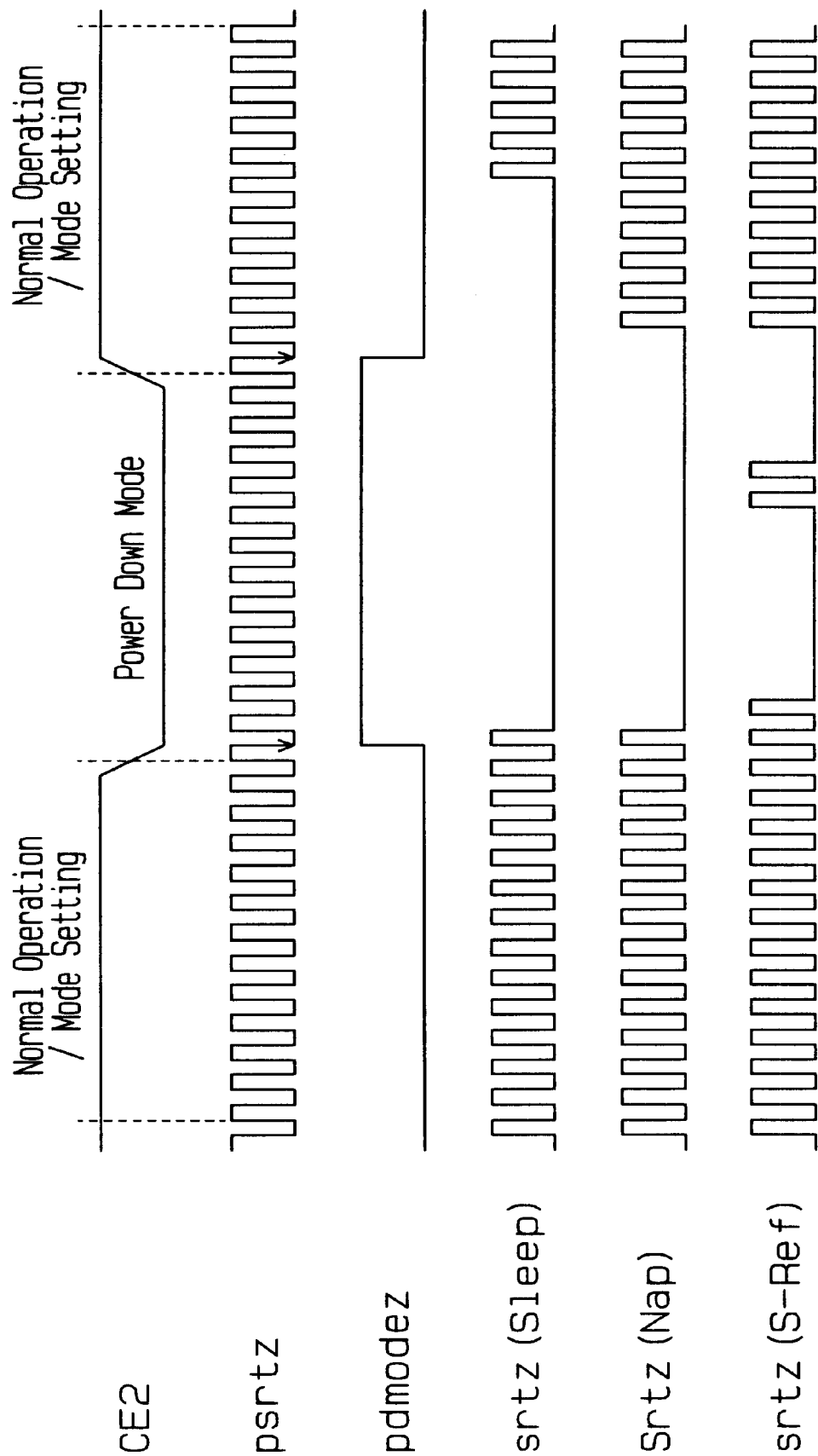
FIG. 22 is a diagram showing the waveform of the refresh control circuit of FIG. 14.

FIG. 22 is a waveform diagram illustrating the operation of the refresh control circuit 20. When the second chip enable signal CE2 provided to the DRAM 10 goes high, the power down mode signal pdmodez goes low. In response to the low power down mode signal pdmodez, the refresh control circuit 20 generates the refresh signal srtz, which has the same waveform as the refresh demand signal psrtz. The refresh signal srtz refreshes every memory cell of the DRAM core 23.

When the second chip enable signal CE2 provided to the DRAM 10 goes low, the power down mode signal pdmodez goes high. If the sleep mode is selected, the refresh control circuit 20 generates a refresh signal srtz(Sleep) at a low level. In this case, the memory cells of the DRAM core 23 are not all refreshed. The internal power supply circuit 22 is deactivated in the sleep mode. Accordingly, when the DRAM 10 shifts from the sleep mode to normal operation, the internal power supply circuit 22 first generates a predetermined voltage and then restarts memory refreshing.

In the Nap mode, the refresh control circuit 20 generates a refresh signal srtz(Nap) at a low level. In this case, the memory cells of the DRAM core 23 are not all refreshed. The internal power supply circuit 22 is activated in the Nap mode. Accordingly, when the DRAM 10 shifts from the Nap mode to normal operation mode, memory refreshing is immediately started.

Figure 23:
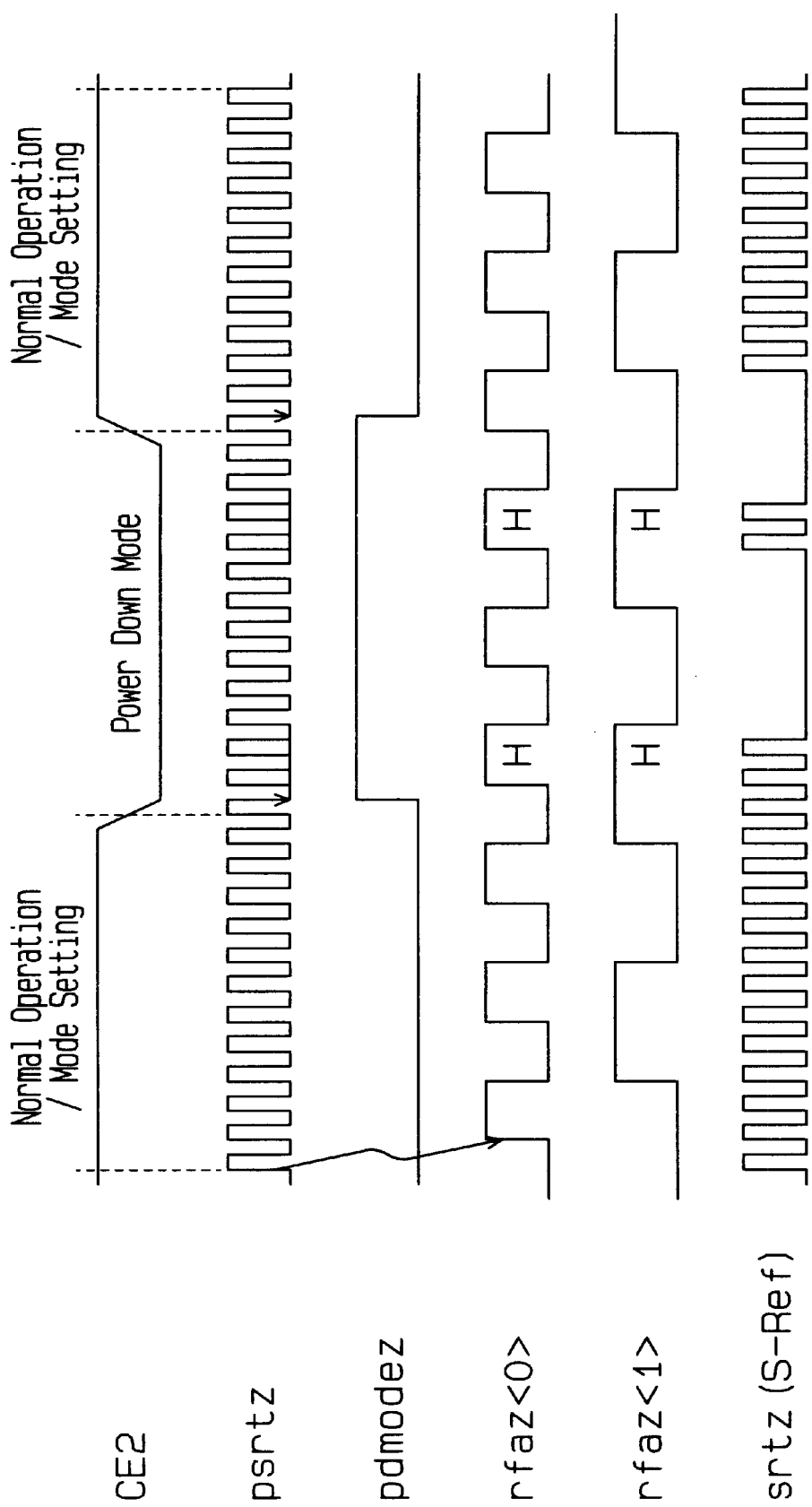
FIG. 23 is a diagram showing the waveform of the refresh control circuit of FIG. 14.

In the S-Ref mode, the refresh control circuit 20 compares the refresh address count signal rfaz<0:1> and the refresh address signal paz<0:1>. Referring to FIG. 23, the refresh control circuit 20 outputs a refresh signal srtz(S-Ref), which has the same waveform as the refresh demand signal psrtz, only when the refresh address count signal rfaz<0:1> and the refresh address signal paz<0:1> match. The refresh signal srtz(S-Ref) refreshes the memory cells of predetermined memory sections in the DRAM core 23.

The DRAM 10 of the preferred embodiment has the advantages discussed below.

(1) In the power down mode, the DRAM 10 functions in the sleep mode, the refresh stop mode (Nap mode), or the partial self-refresh mode (S-Ref mode), which are set by combining the control of voltage supply to the memory core including memory cells and the control of refreshing the memory core. By selecting an appropriate mode, power consumption is reduced and performance is improved in a flexible manner.

(2) The sleep mode, the Nap mode, or the S-Ref mode is selected in the normal operation mode. The DRAM 10 immediately shifts from the normal operation mode to the selected mode in response to a change in the second chip enable signal CE2. Thus, the mode that is to be entered does not have to be determined at the mode shifting time. This decreases the length of time required for shifting modes.

(3) The sleep mode, the Nap mode, or the S-Ref mode is selected based on an external command or the second program mode signal /PE. As a result, the demands of the user (command, signal changes) are satisfied in a flexible manner.

(4) The DRAM 10 shifts to the program mode PRO, which selects the sleep mode, the Nap mode, or the S-Ref mode, by consecutively inputting a plurality of illegal commands. This prevents the DRAM 10 from erroneously shifting to the program mode.

(5) The DRAM 10 performs self-refreshing in the normal operation mode. Accordingly, the DRAM 10 may be used in lieu of an SRAM without having to add a circuit for performing refreshing. This decreases the burden and cost that would be required when making circuit changes (design changes).

It should be apparent to those skilled in the art that the present invention may be embodied in many other specific forms without departing from the spirit or scope of the invention. Particularly, it should be understood that the present invention may be embodied in the following forms.

Instead of setting a certain refresh section in the S-Ref mode, the refresh section may be fixed in accordance with the external specification. In this case, it is preferred that a memory block having satisfactory refreshing characteristics (the leakage of charges from memory cells being low) be selected. The selection of such memory block lengthens refresh intervals and further decreases power consumption in the S-Ref mode.

Figure 24:
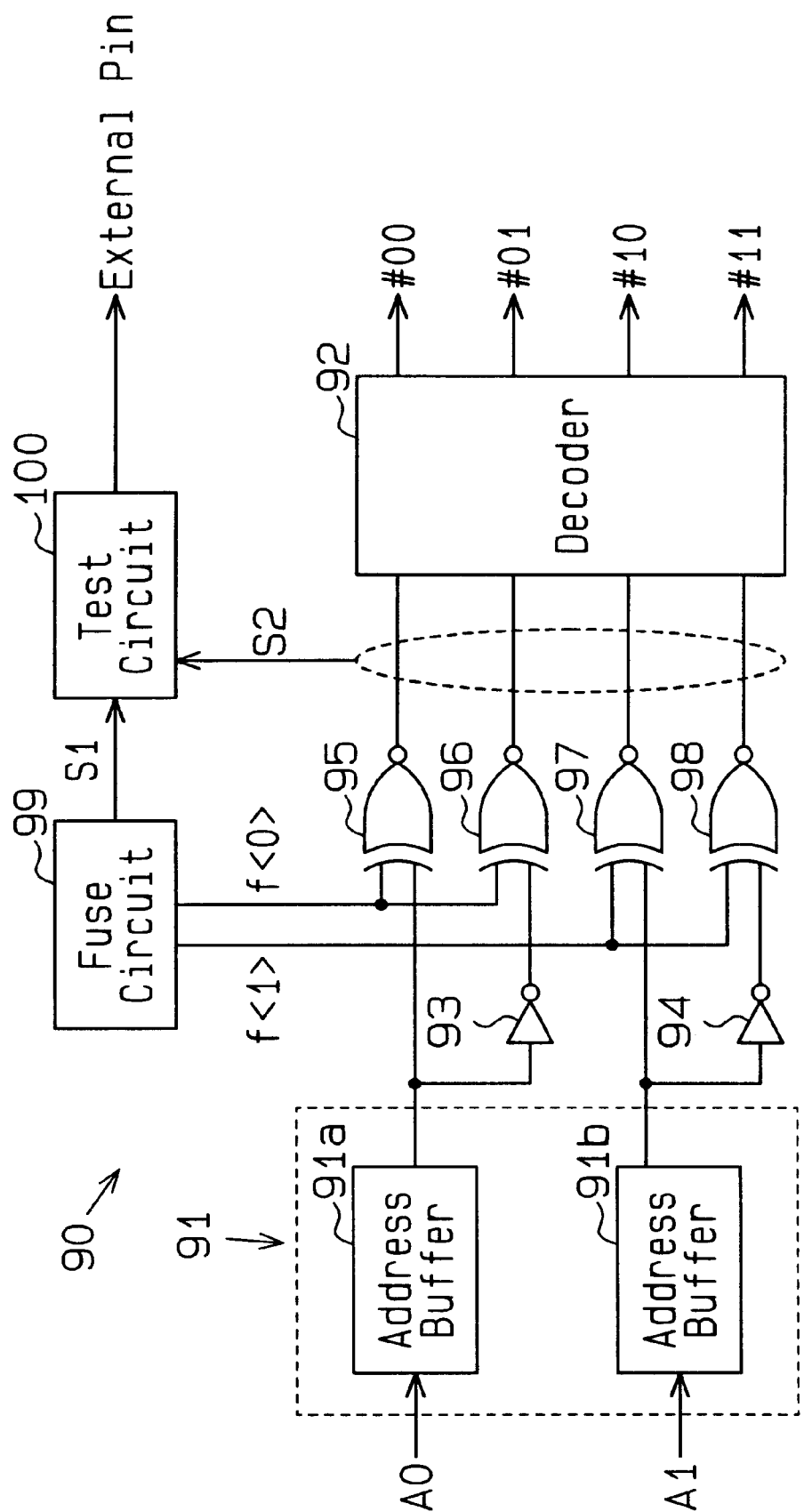
FIG. 24 is a schematic circuit diagram of an address scramble circuit.

It is preferred that address scramble be performed to determine the refresh section having satisfactory refreshing characteristics. FIG. 24 is a schematic block circuit diagram showing an example of an address scramble circuit 90. The address scramble circuit 90 is connected between an address buffer 91 and an address decoder 92. The address buffer 91 has an address buffer 91a for amplifying an address signal A0 and an address buffer 91b for amplifying an address signal A1.

The address scramble circuit 90 includes inverter circuits 93, 94, four ENOR circuits 95–98, and a fuse circuit 99. The output signal of the address buffer 91a is provided to the inverter circuit 93 and a first input terminal of the ENOR circuit 95. The output signal of the inverter circuit 93 is provided to a first input terminal of the ENOR circuit 96. The output signal of the address buffer 91b is provided to the inverter circuit 94 and a first input terminal of the ENOR circuit 97. The output signal of the inverter circuit 94 is provided to a first input terminal of the ENOR circuit 98.

The fuse circuit 99 provides a fuse signal f<0> to second input terminals of the ENOR circuits 95, 96 and a fuse signal f<1> to second input terminals of the ENOR circuits 97, 98. The output signals of the ENOR circuits 95–98 are provided to the decoder 92. The decoder 92 outputs selection signals (#00–#11) of memory blocks of a DRAM core.

The fuse circuit 99 includes a nonvolatile element (e.g., a fuse that is breakable by a laser or the like). The fuse circuit 99 may include a nonvolatile element such as a PROM.

The fuse circuit 99 stores fuse information obtained beforehand through characteristic experiments of the memory conducted by a test circuit 100. Based on the information, the fuse circuit 99 outputs fuse signals f<0:1>.

The address scramble circuit 90 performs an EOR logic operation with the fuse signals f<0:1> and the address signals A0, A1. Then, the address scramble circuit 90 replaces the memory block number corresponding to the address signals A0, A1 with the memory block number corresponding to the fuse signals f<0:1>. FIG. 25 is a table showing the relationship between the fuse signals f<0:1> and the address signals A0, A1.

When the fuse signals f<0:1> are low, a memory block is selected based on the address signals A0, A1. For example, when the address signals A0, A1 are both low, memory block #00 is selected.

When at least one of the fuse signals f<0:1> is high, a memory block is selected based on the fuse signals f<0:1> and the address signals A0, A1. For example, a memory block #01 is selected when the fuse signals f<0:1> are respectively low and high and the address signals A0, A1 are both low.

The read signal S1 of the fuse information stored in the fuse circuit 99 or the scrambled address information (signal S2) may be provided to the external test circuit 100. This enables an external device to confirm the replacement of memory areas.

Figure 26:
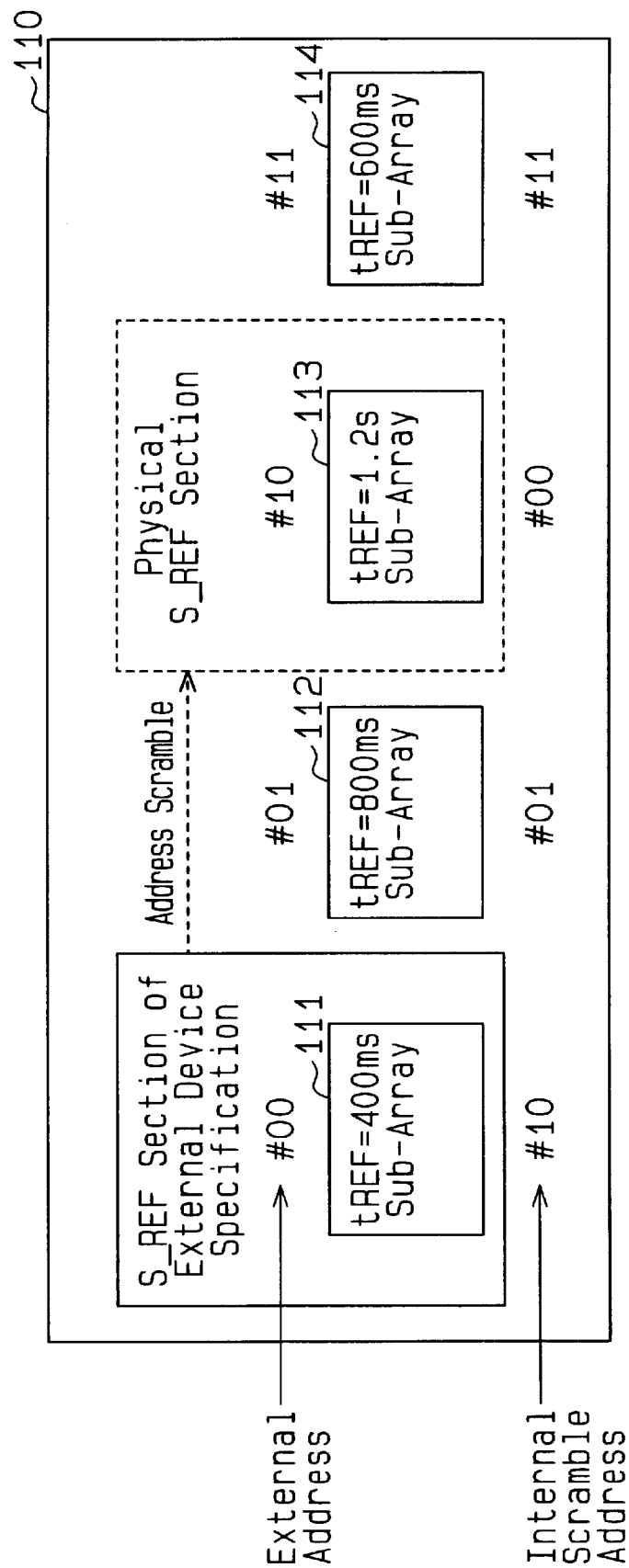
FIG. 26 is a schematic block diagram of a memory array.

FIG. 26 is a diagram illustrating address scramble. A memory array 110 includes four sub-arrays 111, 112, 113, 114. External addresses define blocks #00, #01, #10, #11 that correspond to each sub-array. Based on the results of a characteristic experiment, it is presumed that the blocks #00–#11 respectively have refreshing characteristics (tREF) of 400 ms, 800 ms, 1.2 s, and 600 ms. Based on the characteristics, the self-refresh cycle of the memory array 110 in the normal operation mode is set at 400 ms based on the refreshing characteristic of block #00. Accordingly, the refresh section of the DRAM in the S-Ref mode is set to block #00. However, the refreshing characteristic of block #10 is superior to that of block #00. Accordingly, address scramble replaces the logical S-Ref section, which is based on the external specification, with the physical S-Ref section. Due to such address scramble, the refreshing interval of block #10, which has been replaced, is three times that of block #00 in the S-Ref mode. The power consumption in the S-Ref mode when address scramble is performed is less that that when address scramble is not performed, and the power consumption required for refreshing the entire memory array 110 is one fourth or less.

The number of memory sections, which the DRAM core 23 is divided into in the S-Ref mode, may be changed when required. Further, information related to changes in the number of divided sections may be added to the address signal that is received as a code.

Instead of a semiconductor memory device that enters the power mode based on a program cycle and an external exclusive terminal, the present invention may be embodied in a semiconductor memory device that enters the power down mode based on either a program cycle or an external exclusive terminal.

The present invention may be applied to a semiconductor memory device such as a fast cycle RAM (FCRAM).

The process for manufacturing the DRAM 10 is not limited to the CMOS process and may be a Bi-CMOS process.

The present examples and embodiments are to be considered as illustrative and not restrictive, and the invention is not to be limited to the details given herein, but may be modified within the scope and equivalence of the appended claims.

What is claimed is:

1. A semiconductor memory device, comprising:
    a plurality of memory cells that are refreshed to maintain data, wherein the semiconductor memory device includes a normal operation mode for performing normal operation with the memory cells and a plurality of low power consumption modes, and wherein each of the low power consumption modes controls an internal power supply of the semiconductor memory device and a refresh operation of the memory cells; and
    a mode setting circuit for setting one of the low power consumption modes.

2. The semiconductor memory device according to claim 1, wherein the semiconductor memory device periodically self-refreshes all of the memory cells in the normal operation mode.

3. A semiconductor memory device comprising:
    a plurality of memory cells that are refreshed to maintain data, wherein the semiconductor memory device includes a normal operation mode for performing normal operation with the memory cells and a plurality of low power consumption modes;
    a mode setting circuit for setting one of the low power consumption modes; and
    a determination circuit for determining based on an external signal and an internal signal of the semiconductor memory device whether the mode is in the normal operation mode or a power down mode that includes the low power consumption modes.

4. The semiconductor memory device according to claim 3, wherein the determination circuit receives the external signal in response to the internal signal and generates the power down mode signal, the semiconductor memory device further comprising:
    a refresh control circuit connected to the mode setting circuit and the determination circuit for generating a refresh signal corresponding to one of the low power consumption modes set by the mode setting circuit in response to the power down mode signal.

5. The semiconductor memory device according to claim 4, further comprising an external terminal for receiving the external signal.

6. A semiconductor memory device, comprising:
    a memory core including a plurality of memory cells that are refreshed to maintain data, wherein the semiconductor memory device includes a normal operation mode for performing normal operation with the memory cells and a plurality of low power consumption modes;
    an internal power supply circuit connected to the memory core for supplying the memory core with a power supply voltage, wherein the plurality of low power consumption modes includes one of a first low power consumption mode for stopping the refreshing of all of the memory cells and stopping the operation of the internal power supply circuit, a second low power consumption mode for stopping the refreshing of all of the memory cells and continuing the operation of the internal power supply circuit, and a third low power consumption mode for partially refreshing the memory cells and continuing the operation of the internal power supply circuit; and
    a mode setting circuit for setting one of the low power consumption modes.

7. The semiconductor memory device according to claim 6, wherein the normal operation mode includes a standby mode and a program mode entered from the standby mode, and wherein the mode setting circuit sets a part of the memory cells that are to be refreshed in the third low power consumption mode during the program mode.

8. The semiconductor memory device according to claim 6, wherein the normal operation mode includes a standby mode and a program mode entered from the standby mode, and wherein the mode setting circuit sets one of the low power consumption modes during the program mode.

9. The semiconductor memory device according to claim 8, wherein the semiconductor memory device shifts from the standby mode to the program mode based on a command or an external signal.

10. The semiconductor memory device according to claim 9, wherein the command includes an illegal command that is not used during the normal operation mode.

11. The semiconductor memory device according to claim 10, further comprising:
    a command decoder for receiving the illegal command, wherein the command decoder determines to shift to the program mode when consecutively receiving a plurality of the illegal commands.

12. The semiconductor memory device according to claim 11, wherein the command decoder stops shifting to the program mode when, subsequent to the receipt of the illegal command, the command decoder receives a command that differs from the illegal command.

13. The semiconductor memory device according to claim 9, wherein the mode setting circuit receives information for setting the third low power consumption mode and sets a part of the memory cells that are to be refreshed in the third low power consumption mode based on the information during the program mode.

14. The semiconductor memory device according to claim 9, wherein the external signal includes a program mode signal.

15. The semiconductor memory device according to claim 14, wherein the semiconductor memory device receives a program mode signal and determines whether to shift to the program mode based on changes in the pattern of the program mode signal.

16. The semiconductor memory device according to claim 6, wherein the plurality of memory cells are arranged in a plurality of block sections, and wherein an arbitrary block section is selected in the third operation mode.

17. The semiconductor memory device according to claim 6, wherein the plurality of memory cells are arranged in a plurality of block sections, and wherein an arbitrary number of the block sections is selected during the third operation mode.

18. The semiconductor memory device according to claim 6, wherein the plurality of memory cells are arranged in a plurality of block sections, each of which has a different refreshing characteristic, and wherein the block section having the best refreshing characteristic is selected as the section that is to be refreshed during the third operation mode.

19. A semiconductor memory device, comprising:

a plurality of memory cells arranged in a plurality of memory sections, wherein the memory cells are refreshed to maintain data, and wherein the semiconductor memory device includes a refresh mode for refreshing the memory cells in only a part of the memory sections, each of the memory sections having an inherent refreshing characteristic; and a selection circuit for selecting the part of the memory sections that has the best refreshing characteristic.

20. A semiconductor memory device, comprising:

a plurality of memory cells arranged in first and second memory sections, wherein the memory cells are refreshed to maintain data and wherein the semiconductor memory device includes a refresh mode for refreshing the memory cells in only the second memory section that has a refreshing characteristic better than that of the first section; and a selection circuit for selecting the second memory section, wherein the selection circuit includes an address scramble circuit for converting first address information that designates the first memory section to second address information, which designates the second memory section.

21. The semiconductor memory device according to claim 20, wherein the address scramble circuit includes a nonvolatile element for storing conversion information used to convert the first address information to the second address information.

22. The semiconductor memory device according to claim 21, further comprising a circuit for outputting the second address information.

23. A memory system, comprising:

a first semiconductor memory device; and a second semiconductor memory device connected to the first semiconductor memory device, wherein the second semiconductor memory device includes:

a plurality of memory cells that are refreshed to maintain data, wherein the second semiconductor memory device includes a normal operation mode for performing normal operation with the memory cells and a plurality of low power consumption modes, and wherein each of the low power consumption modes controls an internal power supply of the semiconductor memory device and a refresh operation of the memory cells; and a mode setting circuit for setting one of the low power consumption modes.

24. A semiconductor memory device, comprising:

a plurality of memory cells that are refreshed to maintain data, wherein the semiconductor memory device includes a normal operation mode for performing normal operation with the memory cells and a plurality of low power consumption modes;

a command decoder for receiving a command and generating a first program mode signal based on the command;

an entry control circuit connected to the command decoder for receiving the first program mode signal from the command decoder and generating a program mode entry signal based on the first program mode signal; and a mode setting circuit connected to the entry control circuit for setting one of the low power consumption modes in response to the program mode entry signal.

25. The semiconductor memory device according to claim 24, wherein the entry control circuit stops generating the program mode entry signal when provided with a normal operation mode signal subsequent to the first program mode signal.

26. The semiconductor memory device according to claim 24, further comprising:

an external signal entry circuit connected to the entry control circuit for receiving a second program mode signal and providing the second program mode signal to the entry control circuit.

27. The semiconductor memory device according to claim 24, further comprising:

a refresh control circuit connected to the mode setting circuit for generating a refresh signal that corresponds to one of the low power consumption modes set by the mode setting circuit.

28. The semiconductor memory device according to claim 27, further comprising:

a determination circuit connected to the refresh control circuit for determining whether the mode is in the normal operation mode or a power down mode that includes the low power consumption modes based on an external signal and an internal signal of the semiconductor memory device, wherein the determination circuit provides the power down mode signal to the refresh control circuit when the mode is the power down mode.

29. The semiconductor memory device according to claim 28, wherein the external signal is a chip enable signal and the internal signal is a refresh demand signal, the semiconductor memory device further comprising:

a refresh operation determination circuit connected to the determination circuit for generating the refresh demand signal.

30. A semiconductor memory device, comprising:

a plurality of memory cells that are refreshed to maintain data, wherein the semiconductor memory device includes a normal operation mode for performing normal operation with the memory cells and a plurality of low power consumption modes, and wherein each of the low power consumption modes controls an internal power supply of the semiconductor memory device and a refresh operation of the memory cells;

a mode setting circuit for generating a refresh operation mode signal corresponding to one of the low power consumption modes; and a refresh control circuit connected to the mode setting circuit for comparing a setting address of the memory cells that are to be refreshed with a refresh counter address in response to the refresh operation mode signal and generating the refresh signal when the setting address and the refresh counter address match.

* * * * *